US012635563B2

(12) United States Patent
Oh et al.

(10) Patent No.: US 12,635,563 B2
(45) Date of Patent: May 19, 2026

(54) DISPLAY DEVICE INCLUDING CONNECTION PART OVERLAPPING WITH LIGHT BLOCKING PATTERN, AND METHOD OF MANUFACTURING THE SAME

(71) Applicant: Samsung Display Co., Ltd., Yongin-si (KR)

(72) Inventors: Eon Seok Oh, Seongnam-si (KR); Taehyun Sung, Uiwang-si (KR); Je-Hyun Song, Asan-si (KR); Jungmin Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 929 days.

(21) Appl. No.: 17/696,587

(22) Filed: Mar. 16, 2022

(65) Prior Publication Data

US 2022/0367772 A1     Nov. 17, 2022

(30) Foreign Application Priority Data

May 12, 2021     (KR) ........................ 10-2021-0061594

(51) Int. Cl.
*H01L 25/16*          (2023.01)
*H01L 25/075*         (2006.01)
(Continued)

(52) U.S. Cl.
CPC ........ *H01L 25/167* (2013.01); *H01L 25/0753* (2013.01); *H10H 20/01* (2025.01);
(Continued)

(58) Field of Classification Search
CPC ... H01L 25/167; H01L 25/0753; H10H 20/01; H10H 20/8312; H10H 20/857;
(Continued)

(56) References Cited

U.S. PATENT DOCUMENTS

| | | | |
|---|---|---|---|
| 9,761,651 B2 | 9/2017 | Chang et al. | |
| 10,044,002 B2 | 8/2018 | Lee et al. | |
| 10,707,438 B2* | 7/2020 | Kwon | ................. H10K 50/824 |
| 10,840,317 B2 | 11/2020 | Oh et al. | |

(Continued)

FOREIGN PATENT DOCUMENTS

| | | |
|---|---|---|
| JP | 2016-38556 A | 3/2016 |
| KR | 10-2006-0000356 A | 1/2006 |

(Continued)

*Primary Examiner* — Tan N Tran
(74) *Attorney, Agent, or Firm* — Womble Bond Dickinson (US) LLP

(57)          ABSTRACT

A display device includes a display panel including: a first display region; a main display region; first light-emitting elements at the first display region; a connection part at the first display region, and connecting adjacent first light-emitting elements from among the first light-emitting elements to each other; and a light blocking pattern overlapping with the connection part in a plan view. The light blocking pattern includes: a first light blocking pattern spaced from the first light-emitting elements with a first gap between the first light blocking pattern and adjacent ones of the first light-emitting elements, the first light blocking pattern being located at the same layer as that at which at least a portion of each of the first light-emitting elements is located; and a second light blocking pattern under the first light blocking pattern, at least a portion of the second light blocking pattern overlapping with the first gap.

17 Claims, 14 Drawing Sheets

(51) Int. Cl.

| | |
|---|---|
| *H10H 20/01* | (2025.01) |
| *H10H 20/831* | (2025.01) |
| *H10H 20/857* | (2025.01) |
| *H10K 59/65* | (2023.01) |
| *H10K 59/80* | (2023.01) |

(52) U.S. Cl.
CPC ...... *H10H 20/8312* (2025.01); *H10H 20/857* (2025.01); *H10H 20/032* (2025.01); *H10H 20/0364* (2025.01); *H10K 59/65* (2023.02); *H10K 59/80521* (2023.02); *H10K 59/8791* (2023.02)

(58) Field of Classification Search
CPC .. H10H 20/032; H10H 20/0364; H10H 20/84; H10H 20/852; H10K 59/65; H10K 59/80521; H10K 59/8791; H10K 59/121; H10K 59/1213; H10K 59/123; H10K 59/126; H10K 59/124; H10K 59/131
See application file for complete search history.

(56) References Cited

U.S. PATENT DOCUMENTS

| | | | |
|---|---|---|---|
| 10,868,280 | B2 | 12/2020 | Lee et al. |
| 11,302,270 | B2 * | 4/2022 | Huang ................. G09G 3/3648 |
| 12,022,686 | B2 * | 6/2024 | Zhou ................. H10K 59/1213 |
| 12,063,840 | B2 * | 8/2024 | Chen ................... H10K 59/123 |
| 12,238,985 | B2 * | 2/2025 | Huang ............ H10K 59/80515 |
| 2020/0365664 | A1 | 11/2020 | Jeon et al. |
| 2020/0365674 | A1 | 11/2020 | Jeon et al. |
| 2021/0305343 | A1 | 9/2021 | Oh et al. |

FOREIGN PATENT DOCUMENTS

| | | |
|---|---|---|
| KR | 10-2016-0117728 A | 10/2016 |
| KR | 10-2017-0014043 A | 2/2017 |
| KR | 10-2017-0088457 A | 8/2017 |
| KR | 10-2019-0088148 A | 7/2019 |
| KR | 10-2020-0102580 A | 9/2020 |
| KR | 10-2020-0131397 A | 11/2020 |
| KR | 10-2020-0131400 A | 11/2020 |
| KR | 10-2021-0121372 A | 10/2021 |

* cited by examiner

FIG. 8

DISPLAY DEVICE INCLUDING CONNECTION PART OVERLAPPING WITH LIGHT BLOCKING PATTERN, AND METHOD OF MANUFACTURING THE SAME

CROSS-REFERENCE TO RELATED APPLICATIONS

This application claims priority to and the benefit of Korean Patent Application No. 10-2021-0061594, filed on May 12, 2021, the entire content of which is incorporated by reference herein.

BACKGROUND

Aspects of one or more embodiments of the present disclosure relate to a display device and a method of manufacturing the same, and more particularly, to a display device having improved transmittance in some regions thereof and improved reliability.

A display device may be a device including various electronic components, such as a display panel that displays an image, an input sensing member that senses an external input, and an electronic module. The electronic components may be electrically connected to each other via signal lines arranged in various forms. The display panel includes a light-emitting element that generates light. The input sensing member may include sensing electrodes for sensing external inputs. The electronic module may include a camera, an infrared detection sensor, a proximity sensor, and the like. The electronic module may be disposed under the display panel.

The above information disclosed in this Background section is for enhancement of understanding of the background of the present disclosure, and therefore, it may contain information that does not constitute prior art.

SUMMARY

One or more embodiments of the present disclosure are directed to a display device having improved transmittance in some areas thereof, and having improved reliability for preventing or substantially preventing the occurrence of defects in electrodes.

One or more embodiments of the present disclosure are directed to a manufacturing method of a display device that supplies a high-quality image, and in which defects that may occur in manufacturing processes may be prevented or reduced.

According to one or more embodiments of the present disclosure, a display device includes a display panel including a first display region, and a main display region surrounding at least a portion of the first display region, the display panel including: a plurality of first light-emitting elements at the first display region; a connection part at the first display region, and connecting adjacent first light-emitting elements from among the plurality of first light-emitting elements to each other; and a light blocking pattern overlapping with the connection part in a plan view. The light blocking pattern includes: a first light blocking pattern spaced from the plurality of first light-emitting elements with a first gap between the first light blocking pattern and adjacent ones of the first light-emitting elements, the first light blocking pattern being located at the same layer as that at which at least a portion of each of the plurality of first light-emitting elements is located; and a second light blocking pattern under the first light blocking pattern, at least a portion of the second light blocking pattern overlapping with the first gap.

In an embodiment, each of the plurality of first light-emitting elements may include: a first lower electrode; a first light-emitting layer on the first lower electrode; and a first upper electrode on the first light-emitting layer, and the first light blocking pattern may be located at the same layer at which the first lower electrode is located.

In an embodiment, the first light blocking pattern and the first lower electrode may include the same material as each other.

In an embodiment, the connection part and the first upper electrode may include the same material as each other.

In an embodiment, a plurality of electrode openings may be defined in the first upper electrode.

In an embodiment, the first display region may include: an element region at which the plurality of first light-emitting elements are located; a wiring region at which the connection part is located; and a transmission region adjacent to the element region and the wiring region, and each of the first lower electrode and the first upper electrode may overlap with the element region, and may not overlap with the transmission region.

In an embodiment, the display panel may include: a base layer configured to provide a base surface on which the plurality of first light-emitting elements are located; and a circuit layer between the base layer and the plurality of first light-emitting elements. The circuit layer may include a plurality of insulating layers, and the second light blocking pattern may be located on the base layer or on any one layer from among the plurality of insulating layers.

In an embodiment, the second light blocking pattern may include a first sub blocking pattern and a second sub blocking pattern; a second gap overlapping with a portion of the connection part may be defined between the first sub blocking pattern and the second sub blocking pattern; and the first light blocking pattern may overlap with the second gap.

In an embodiment, the display panel may further includes a second display region adjacent to the first display region, and the display panel may further include: a second light-emitting element at the second display region; a first pixel circuit at the second display region, and configured to drive the first light-emitting element; and a second pixel circuit at the second display region, and configured to drive the second light-emitting element.

In an embodiment, the display panel may further include: a third light-emitting element at the main display region; and a third pixel circuit at the main display region, and configured to drive the third light-emitting element. A transmittance of the first display region may be higher than a transmittance of the second display region and a transmittance of the main display region.

In an embodiment, a thickness of the second light blocking pattern may be about 100 nm to about 500 nm.

In an embodiment, the display device may further include an electronic module located under the display panel, and overlapping with the first display region in a plan view.

In an embodiment, the light blocking pattern may include a metal material, and the metal material may be configured to absorb or reflect an incident infrared laser.

In an embodiment, a portion of the second light blocking pattern may overlap with the first light blocking pattern in a plan view.

According to one or more embodiments of the present disclosure, a display device includes: a base layer; a circuit layer on the base layer; a plurality of first light-emitting elements on the circuit layer; a connection part configured to connect adjacent first light-emitting elements from among the plurality of first light-emitting elements to each other; and a light blocking pattern overlapping with the connection part in a plan view. Each of the plurality of first light-emitting elements includes: a first lower electrode; a first light-emitting layer on the first lower electrode; and a first upper electrode on the first light-emitting layer. The circuit layer includes a plurality of insulating layers, and the light blocking pattern includes: a first light blocking pattern spaced from the first lower electrode, and located at the same layer as that of the first lower electrode, and a second light blocking pattern on the base layer or on any one layer from among the plurality of insulating layers, at least a portion of the second light blocking pattern overlapping with a gap defining the space between the first lower electrode and the first light blocking pattern.

In an embodiment, the first light blocking pattern and the first lower electrode may include the same material as each other.

In an embodiment, the connection part and the first upper electrode may include the same material as each other.

According to one or more embodiments of the present disclosure, a method of manufacturing a display device, includes: providing a preliminary display panel in which a first display region and a main display region are defined, the main display region surrounding at least a portion of the first display region, and the first display region including an element region, a wiring region, and a transmission region adjacent to the element region and the wiring region; and irradiating a laser to the transmission region from a lower side of the preliminary display panel. The preliminary display panel includes: a plurality of first light-emitting elements at the element region; a connection part at the wiring region, and connecting adjacent first light-emitting elements from among the plurality of first light-emitting elements to each other; and a light blocking pattern overlapping with the connection part in a plan view. The light blocking pattern includes: a first light blocking pattern spaced from the plurality of first light-emitting elements, and located at the same layer at which at least a portion of each of the plurality of first light-emitting elements is located; and a second light blocking pattern under the first light blocking pattern, at least a portion of the second light blocking pattern overlapping with the plurality of first light-emitting elements and a gap defining the space between the first light blocking pattern and the first light-emitting elements.

In an embodiment, each of the plurality of first light-emitting elements may include: a first lower electrode; a first light-emitting layer on the first lower electrode; and a preliminary first upper electrode on the first light-emitting layer, and the irradiating of the laser may include irradiating a portion of the preliminary first upper electrode overlapping with the transmission region with the laser.

In an embodiment, the light blocking pattern may be configured to absorb or reflect the laser.

BRIEF DESCRIPTION OF THE FIGURES

The above and other aspects and features of the present disclosure will be more clearly understood from the following detailed description of the illustrative, non-limiting example embodiments with reference to the accompanying drawings. In the drawings:

FIG. 8 is a cross-sectional view of a display panel according to an embodiment of the present disclosure;

DETAILED DESCRIPTION

Figure 1:
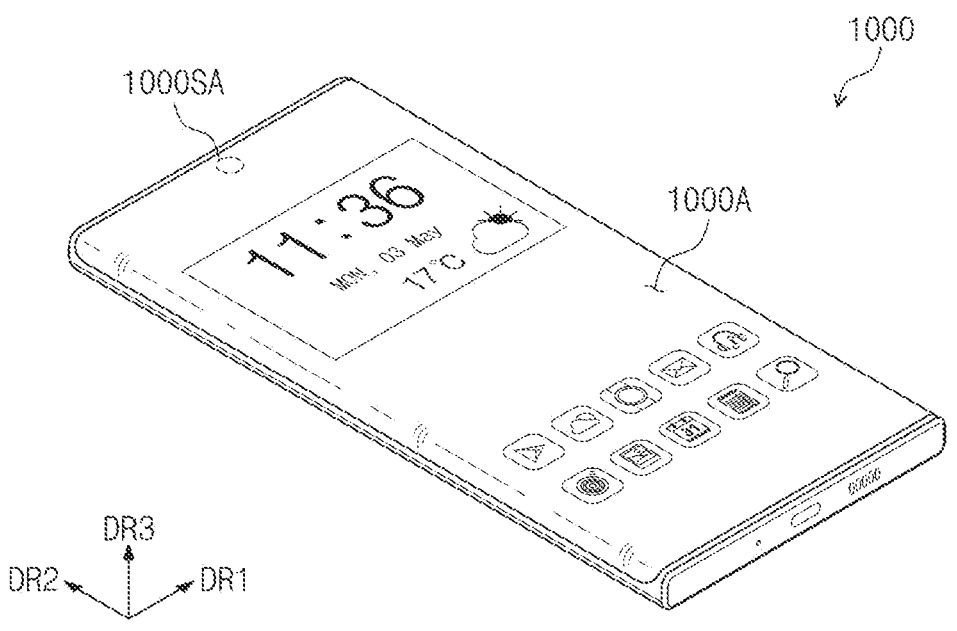
FIG. 1 is a perspective view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. For example, the thickness, the ratio, and/or the dimensions of the elements shown in the drawings may be exaggerated for effective illustration. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features.

Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, a first direction DR1, a second direction DR2, and a third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section.

Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device according to an embodiment of the present disclosure.

Referring to FIG. 1, a display device 1000 may be activated in response to an electrical signal. For example, the display device 1000 may be a mobile phone, a tablet computer, a monitor, a television, a car navigation system, a game machine, a wearable device, or the like, but the present disclosure is not limited thereto. FIG. 1 illustrates an example of the display device 1000 as a mobile phone.

The display device 1000 may display an image through a display region 1000A. The display region 1000A may include a plane defined by a first direction DR1 and a second direction DR2. The display region 1000A may further include curved surfaces bent from at least two sides of the plane, respectively. However, the shape of the display region 1000A is not limited thereto. For example, the display region 1000A may include only the plane, or the display region 1000A may further include two or more curved surfaces, for example, such as four curved surfaces bent from four sides of the plane.

A sensing region 1000SA may be defined at (e.g., in or on) the display region 1000A of the display device 1000. Although one sensing region 1000SA is illustrated in FIG. 1, the number of sensing regions 1000SA is not limited thereto. The sensing region 1000SA may be a portion of the display region 1000A. Accordingly, the display device 1000 may display an image through the sensing region 1000SA.

An electronic module (e.g., an electronic device, sensor, or the like) may be disposed at (e.g., in or on) a region overlapping with the sensing region 1000SA. The electronic module may receive an external input transmitted through the sensing region 1000SA, or may provide an output through the sensing region 1000SA. For example, the electronic module may be a camera module (e.g., a camera), a sensor that measures a distance, for example, such as a proximity sensor, a sensor that recognizes a part of the user's body (e.g., such as a fingerprint, iris, or face), or a small lamp that outputs light, but the present disclosure is not particularly limited thereto.

The thickness direction of the display device 1000 may be parallel to or substantially parallel to a third direction DR3 intersecting the first direction DR1 and the second direction DR2. Accordingly, a front surface (or an upper surface) and a rear surface (or a lower surface) of each of the members constituting the display device 1000 may be defined based on the third direction DR3.

Figure 2:
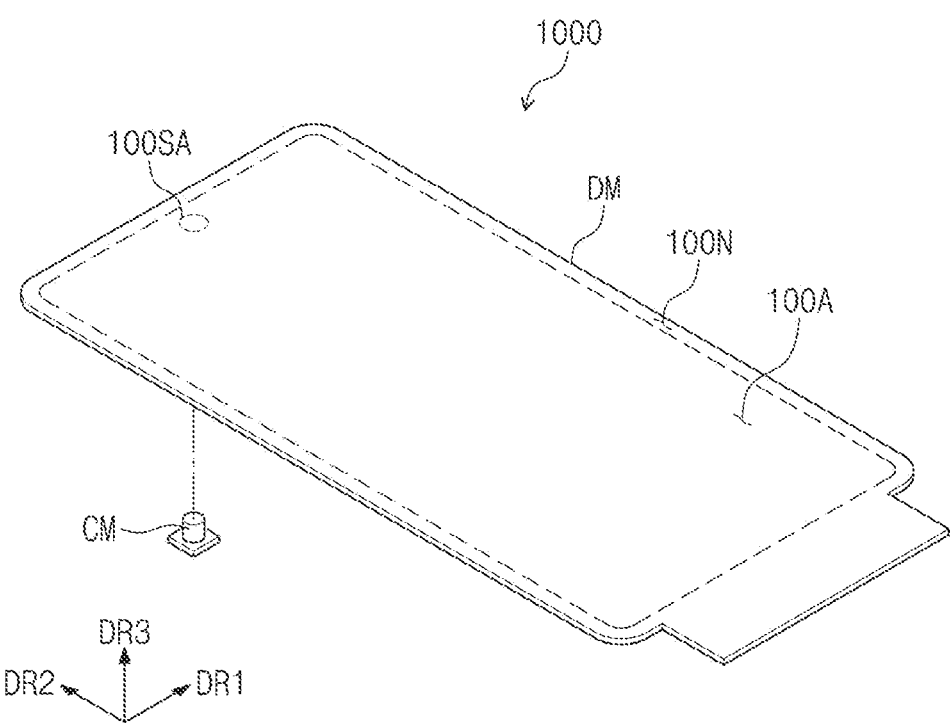
FIG. 2 is an exploded perspective view illustrating some components of a display device according to an embodiment of the present disclosure.

FIG. 2 is an exploded perspective view illustrating some components of a display device according to an embodiment of the present disclosure.

Referring to FIG. 2, the display device 1000 may include a display module (e.g., a display or a display part) DM and an electronic module (e.g., an electronic device, sensor, or the like) CM. The display module DM may be configured to generate an image, and sense an input applied from the outside. The electronic module CM may be disposed under (e.g., underneath) the display module DM, and may be, for example, a camera module (e.g., a camera) or an infrared sensor module (e.g., an infrared sensor). The display module DM may be referred to as a first electronic module, and the electronic module CM may be referred to as a second electronic module.

A display region 100A and a peripheral region 100N may be defined in the display module DM. The display region 100A may correspond to the display region 1000A illustrated in FIG. 1. Some regions of the display module DM may have a higher transmittance than other partial regions, and may be defined as a sensing region 100SA. The sensing region 100SA may be a portion of the display region 100A. In other words, the sensing region 100SA may display an image, and may transmit an external input provided to the electronic module CM and/or an output from the electronic module CM.

Figure 3:
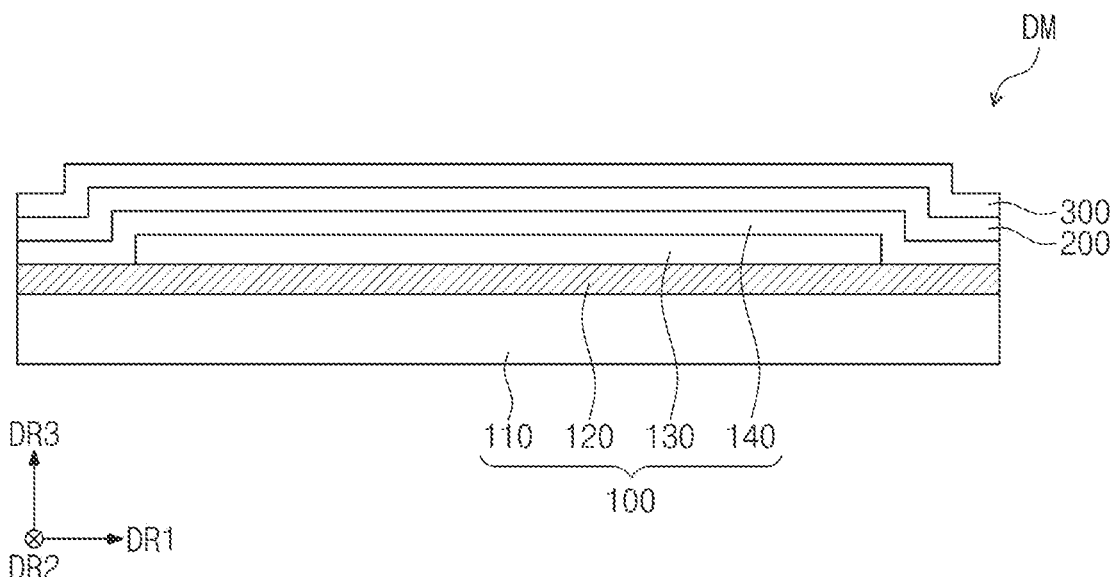
FIG. 3 is a cross-sectional view of a display module according to an embodiment of the present disclosure.

FIG. 3 is a cross-sectional view of a display module according to an embodiment of the present disclosure.

Referring to FIG. 3, the display module DM may include a display panel 100, a sensor layer 200, and an anti-reflection layer 300.

The display panel 100 may be configured to generate or substantially generate an image. The display panel 100 may be a luminescent display panel. For example, the display panel 100 may be an organic light-emitting display panel, an inorganic light-emitting display panel, a quantum dot display panel, a micro LED display panel, or a nano LED display panel. The display panel 100 may be referred to as a display layer.

The display panel 100 may include a base layer 110, a circuit layer 120, a light-emitting element layer 130, and an encapsulation layer 140.

The base layer 110 may be a member that provides a base surface on which the circuit layer 120 is disposed. The base layer 110 may be a rigid substrate, or a flexible substrate capable of bending, folding, rolling, and/or the like. The base layer 110 may be a glass substrate, a metal substrate, or a polymer substrate. However, the present disclosure is not limited thereto, and the base layer 110 may be an inorganic layer, an organic layer, or a composite material layer.

The base layer 110 may have a multilayered structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. As used in the present specification, "~~"-based resin may refer to a resin including a functional group of "~~".

The circuit layer 120 may be disposed on the base layer 110. The circuit layer 120 may include an insulating layer, a semiconductor pattern, a conductive pattern, and a signal line. An insulating layer, a semiconductor layer, and a conductive layer are formed on the base layer 110 by coating, deposition, and/or the like, and then, the insulating layer, the semiconductor layer, and the conductive layer may be selectively patterned through a plurality of photolithographic processes. Thereafter, a semiconductor pattern, a conductive pattern, and a signal line included in the circuit layer 120 may be formed.

The light-emitting element layer 130 may be disposed on the circuit layer 120. The light-emitting element layer 130 may include a light-emitting element. For example, the light-emitting element layer 130 may include an organic light-emitting material, an inorganic light-emitting material, an organic-inorganic light-emitting material, a quantum dot, a quantum rod, a micro LED, or a nano LED.

The encapsulation layer 140 may be disposed on the light-emitting element layer 130. The encapsulation layer 140 may protect the light-emitting element layer 130 from foreign substances, for example, such as moisture, oxygen, and dust particles.

The sensor layer 200 may be disposed on the display panel 100. The sensor layer 200 may detect an external input applied from the outside. The external input may be a user's input. The user's input may include various suitable types of external inputs, for example, such as a part of the user's body, light, heat, a pen, or pressure.

The sensor layer 200 may be formed on the display panel 100 through a continuous process. In this case, the sensor layer 200 may be expressed as being directly disposed on the display panel 100. The phrase the sensor layer "is directly disposed on" the display panel may mean that a third component is not disposed between the sensor layer 200 and the display panel 100. In other words, a separate adhesive member may not be disposed between the sensor layer 200 and the display panel 100. As another example, the sensor layer 200 may be coupled to (e.g., connected to or attached to) the display panel 100 through an adhesive member. The adhesive member may include any suitable adhesive or pressure-sensitive adhesive as would be understood to those having ordinary skill in the art.

The anti-reflection layer 300 may be disposed on the sensor layer 200. The anti-reflection layer 300 may reduce a reflectance of external light incident from the outside of the display module DM. The anti-reflection layer 300 may be formed on the sensor layer 200 through a continuous process. The anti-reflection layer 300 may include color filters. The color filters may have a suitable arrangement (e.g., a predetermined arrangement). For example, the color filters may be arranged in consideration of light emission colors of pixels included in the display panel 100. In addition, the anti-reflection layer 300 may further include a black matrix adjacent to the color filters.

An another example, the anti-reflection layer 300 according to an embodiment of the present disclosure may include a retarder and a polarizer. The retarder may be a film type or a liquid crystal coating type, and may include a half-wave ($\lambda/2$) retarder and/or a quarter-wave ($\lambda/4$) retarder. The polarizer may also be a film type or a liquid crystal coating type. The film type polarizer may include a stretchable synthetic resin film, and the liquid crystal coating type polarizer may include liquid crystals arranged in a suitable arrangement (e.g., a predetermined arrangement). The retarder and the polarizer may be configured as a single polarizing film. The anti-reflection layer 300 may further include a protective film disposed above or below the polarizing film.

In an embodiment of the present disclosure, the sensor layer 200 may be omitted as needed or desired. In this case, the anti-reflection layer 300 may be disposed on the display panel 100. For example, the anti-reflection layer 300 may be directly formed on the display panel 100 through a continuous process.

In an embodiment of the present disclosure, the positions of the sensor layer 200 and the anti-reflection layer 300 may be variously modified. For example, in some embodiments, the anti-reflection layer 300 may be disposed between the display panel 100 and the sensor layer 200.

In some embodiments of the present disclosure, the display module DM may further include an optical layer disposed on the anti-reflection layer 300. For example, the optical layer may be formed on the anti-reflection layer 300 through a continuous process. The optical layer may control a direction of the light incident from the display panel 100 to improve a front luminance of the display module DM. For example, the optical layer may include an organic insulating layer in which openings are defined to correspond to light-emitting regions, respectively, of pixels included in the display panel 100, and a high-refractive-index layer that covers the organic insulating layer and fills the openings. The high-refractive-index layer may have a higher refractive index than that of the organic insulating layer.

Figure 4:
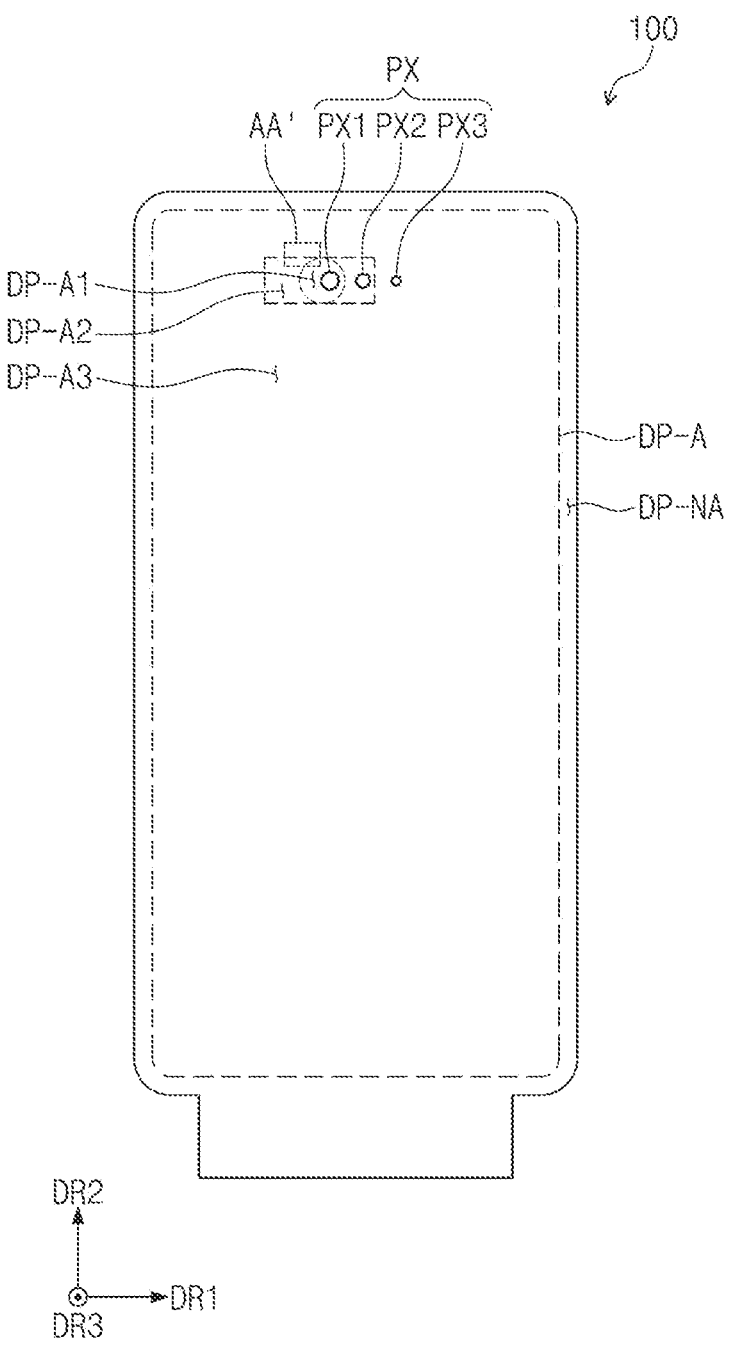
FIG. 4 is a plan view of a display panel according to an embodiment of the present disclosure.
Figure 5:
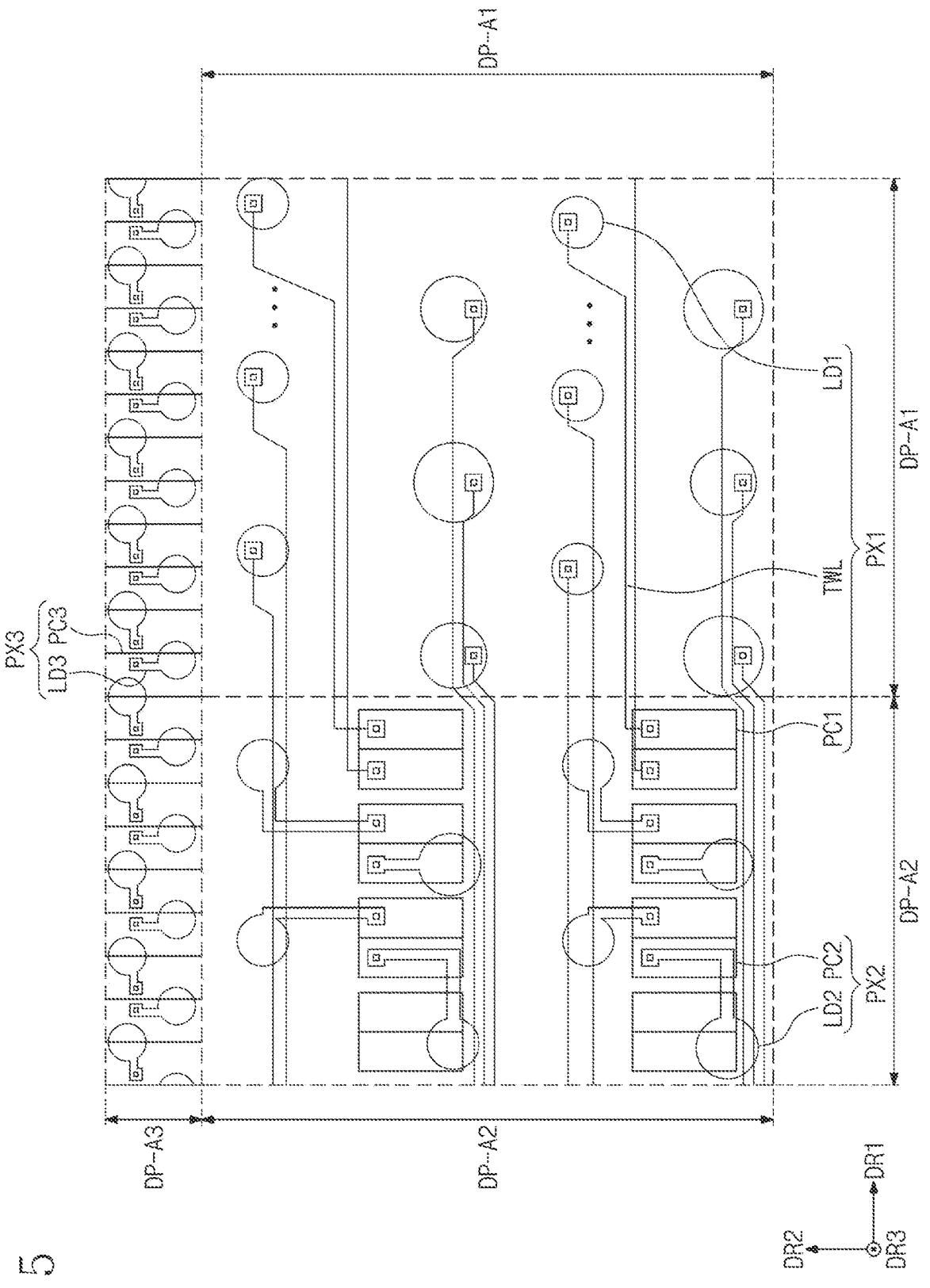
FIG. 5 is an enlarged plan view of a portion of a display panel according to an embodiment of the present disclosure.

FIG. 4 is a plan view of a display panel according to an embodiment of the present disclosure. FIG. 5 is an enlarged plan view of a portion of a display panel according to an embodiment of the present disclosure. For example, FIG. 5 may be an enlarged plan view of the region AA' of FIG. 4.

Referring to FIGS. 4 and 5, the display panel 100 may include a display region DP-A and a peripheral region DP-NA. The peripheral region DP-NA may be adjacent to the display region DP-A, and may surround (e.g., around a periphery of) at least a portion of the display region DP-A.

The display region DP-A may include a first display region DP-A1, a second display region DP-A2, and a main display region DP-A3. The first display region DP-A1 may be referred to as a component region, the second display region DP-A2 may be referred to as an intermediate region or transition region, and the main display region DP-A3 may be referred to as a general display region. The first display region DP-A1 and the second display region DP-A2 may be referred to as an auxiliary display region.

The display panel 100 may include a plurality of pixels PX. The plurality of pixels PX may include a first pixel PX1 that emits light from the first display region DP-A1, a second pixel PX2 that emits light from the second display region DP-A2, and a third pixel PX3 that emits light from the main display region DP-A3.

Each of the first pixel PX1, the second pixel PX2, and the third pixel PX3 may be provided in a plurality. In this case, the first to third pixels PX1, PX2, and PX3 may include red pixels, green pixels, and blue pixels, respectively, and may further include white pixels according to another embodiment.

The first pixel PX1 may include a first light-emitting element LD1, and a first pixel circuit PC1 that drives the first light-emitting element LD1. The second pixel PX2 may include a second light-emitting element LD2, and a second pixel circuit PC2 that drives the second light-emitting element LD2. The third pixel PX3 may include a third light-emitting element LD3, and a third pixel circuit PC3 that drives the third light-emitting element LD3. The positions of the first pixel PX1, the second pixel PX2, and the third pixel PX3 illustrated in FIG. 4 correspond to the positions of the first, second, and third light-emitting elements LD1, LD2, and LD3, respectively.

The first display region DP-A1 may overlap with or correspond to the sensing region 1000SA illustrated in FIG. 1. In other words, the first display region DP-A1 may be provided at (e.g., in or on) a region overlapping with the electronic module CM (e.g., see FIG. 2) in a plan view (e.g., a view from a direction that is parallel to or substantially parallel to the third direction DR3). For example, an external input (e.g., light) may be provided to the electronic module CM through the first display region DP-A1, and an output from the electronic module CM may be emitted to the outside through the first display region DP-A1. In the present embodiment, the first display region DP-A1 is illustrated to have a circular shape, but the present disclosure is not limited thereto, and the first display region DP-A1 may have various suitable shapes, for example, such as a polygon, an ellipse, a shape having at least one curved side, or an irregular shape, and is not limited to any one embodiment.

In order to secure an area of the transmission region, a fewer number of pixels (e.g., for a same sized unit area) may be provided at (e.g., in or on) the first display region DP-A1 than at (e.g., in or on) the main display region DP-A3. A region of the first display region DP-A1 at (e.g., in or on) which the first light-emitting element LD1 is not disposed may be defined as a transmission region TA (e.g., see FIG. 8).

Figure 8:
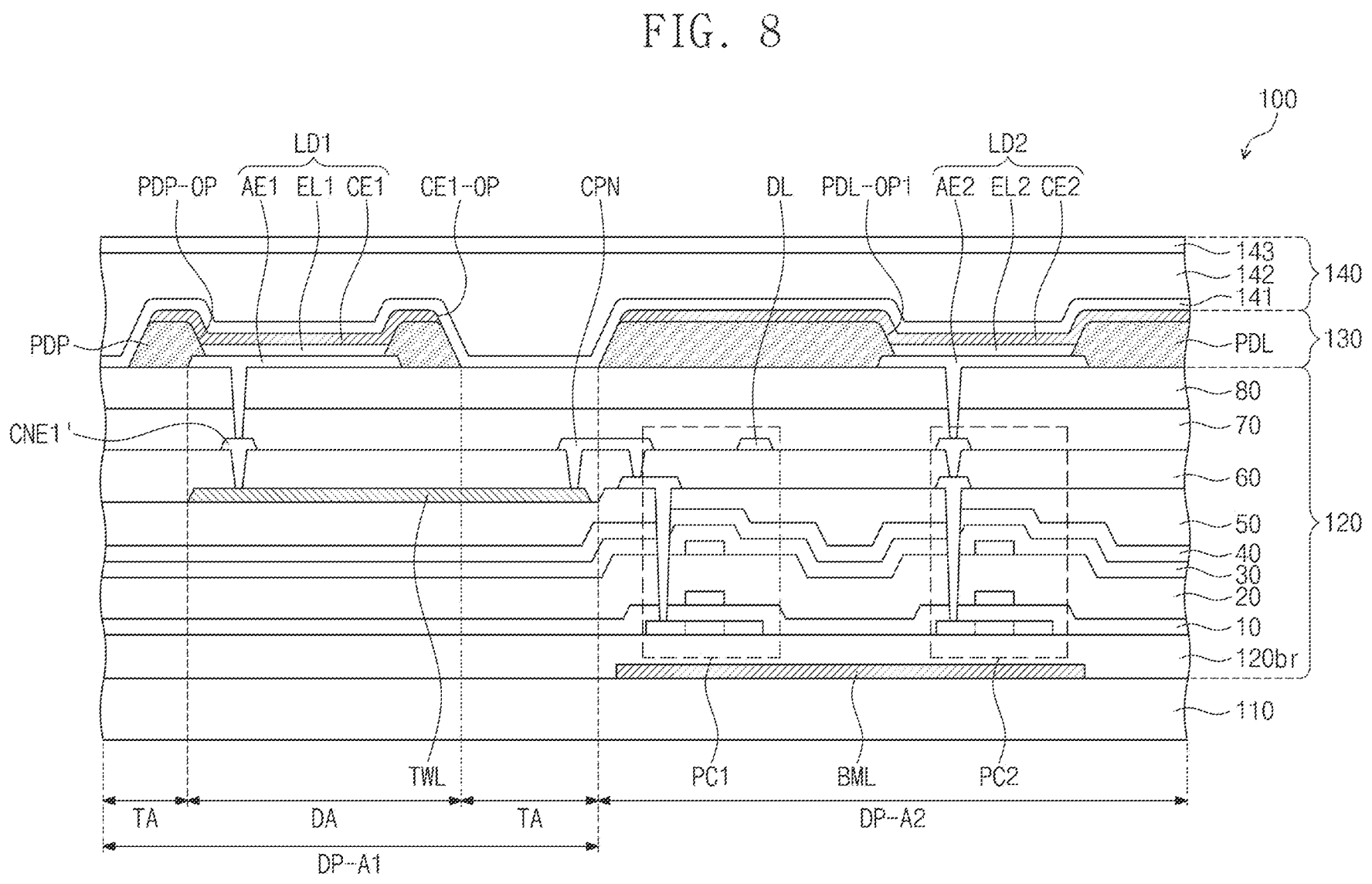

For example, a region of the first display region DP-A1 at (e.g., in or on) which the first electrode of the first light-emitting element LD1 and the pixel defining pattern that surrounds (e.g., around a periphery of) the first electrode are not disposed may be defined as the transmission region TA (e.g., see FIG. 8).

Within a unit area or a same sized area, the number of first pixels PX1 disposed at (e.g., in or on) the first display region DP-A1 may be less than the number of third pixels PX3 disposed at (e.g., in or on) the main display region DP-A3. For example, a resolution of the first display region DP-A1 may be about ½, ⅜, ⅓, ¼, 2/9, ⅛, ⅑, 1/16, or the like of a resolution of the main display region DP-A3. For example, the resolution of the main display region DP-A3 may be about 400 ppi or more, and the resolution of the first display region DP-A1 may be about 200 ppi or about 100 ppi. However, these resolution values are given as examples, and the present disclosure is not particularly limited thereto.

The first pixel circuit PC1 of the first pixel PX1 may not be disposed at (e.g., in or on) the first display region DP-A1. For example, the first pixel circuit PC1 may be disposed at (e.g., in or on) the second display region DP-A2, or at (e.g., in or on) the peripheral region DP-NA. In this case, the light transmittance of the first display region DP-A1 may be higher than when the first pixel circuit PC1 is disposed at (e.g., in or on) the first display region DP-A1.

The first light-emitting element LD1 and the first pixel circuit PC1 may be electrically connected to each other through a connection wiring TWL. The connection wiring TWL may overlap with the transmission region of the first display region DP-A1. The connection wiring TWL may include a transparent conductive wiring. The transparent conductive wiring may include (e.g., may contain) a transparent conductive material or a light transmission material. For example, the connection wiring TWL may include (e.g., may be formed of) a transparent conductive oxide (TCO) film, such as indium tin oxide (ITO), indium zinc oxide (IZO), indium gallium zinc oxide (IGZO), zinc oxide (ZnO), or indium oxide ($In_2O_3$).

The second display region DP-A2 is adjacent to the first display region DP-A1. The second display region DP-A2 may surround (e.g., around a periphery of) at least a portion of the first display region DP-A1. The second display region DP-A2 may have a lower transmittance than that of the first display region DP-A1. In the present embodiment, the second display region DP-A2 may be spaced apart from the peripheral region DP-NA. However, the present disclosure is not limited thereto, and the second display region DP-A2 may be in contact with the peripheral region DP-NA.

The first pixel circuit PC1 of the first pixel PX1, the second light-emitting element LD2, and the second pixel circuit PC2 may be disposed at (e.g., in or on) the second display region DP-A2. Accordingly, the light transmittance of the second display region DP-A2 may be lower than the light transmittance of the first display region DP-A1. In addition, the first pixel circuit PC1 of the first pixel PX1 is disposed at (e.g., in or on) the second display region DP-A2, and therefore, within a unit area or the same sized area, the number of second pixels PX2 disposed at (e.g., in or on) the second display region DP-A2 may be less than the number of third pixels PX3 disposed at (e.g., in or on) the main display region DP-A3. A resolution of an image displayed at (e.g., in or on) the second display region DP-A2 may be lower than a resolution of an image displayed at (e.g., in or on) the main display region DP-A3.

The main display region DP-A3 is adjacent to the second display region DP-A2. The main display region DP-A3 may be adjacent to the first display region DP-A1. The main display region DP-A3 may be defined as a region having a transmittance lower than that of the first display region DP-A1. The third light-emitting element LD3 and the third pixel circuit PC3 may be disposed at (e.g., in or on) the main display region DP-A3.

In some embodiments, the first light-emitting element LD1 disposed at (e.g., in or on) the first display region DP-A1 and most adjacent to (e.g., closest to) the main display region DP-A3 may have a circular shape having a greater width in a specific direction in order to secure a suitable distance to the third light-emitting element LD3 disposed at (e.g., in or on) the main display region DP-A3. For example, when the first display region DP-A1 is adjacent to the main display region DP-A3 in the second direction DR2, the first light-emitting element LD1 may have a greater width in the first direction DR1 than a width in the second direction DR2.

Each of the first light-emitting element LD1, the second light-emitting element LD2, and the third light-emitting element LD3 may be provided in a plurality. A distance between two first light-emitting elements LD1 that are most adjacent to each other from among the plurality of first light-emitting elements LD1 may be greater than a distance between two third light-emitting elements LD3 that are most adjacent to each other from among the plurality of third light-emitting elements LD3. In addition, a distance between two second light-emitting elements LD2 that are most adjacent to each other from among the plurality of second light-emitting elements LD2 may be greater than the distance between the two third light-emitting elements LD3 that are most adjacent to each other from among the plurality of third light-emitting elements LD3.

Figure 7:
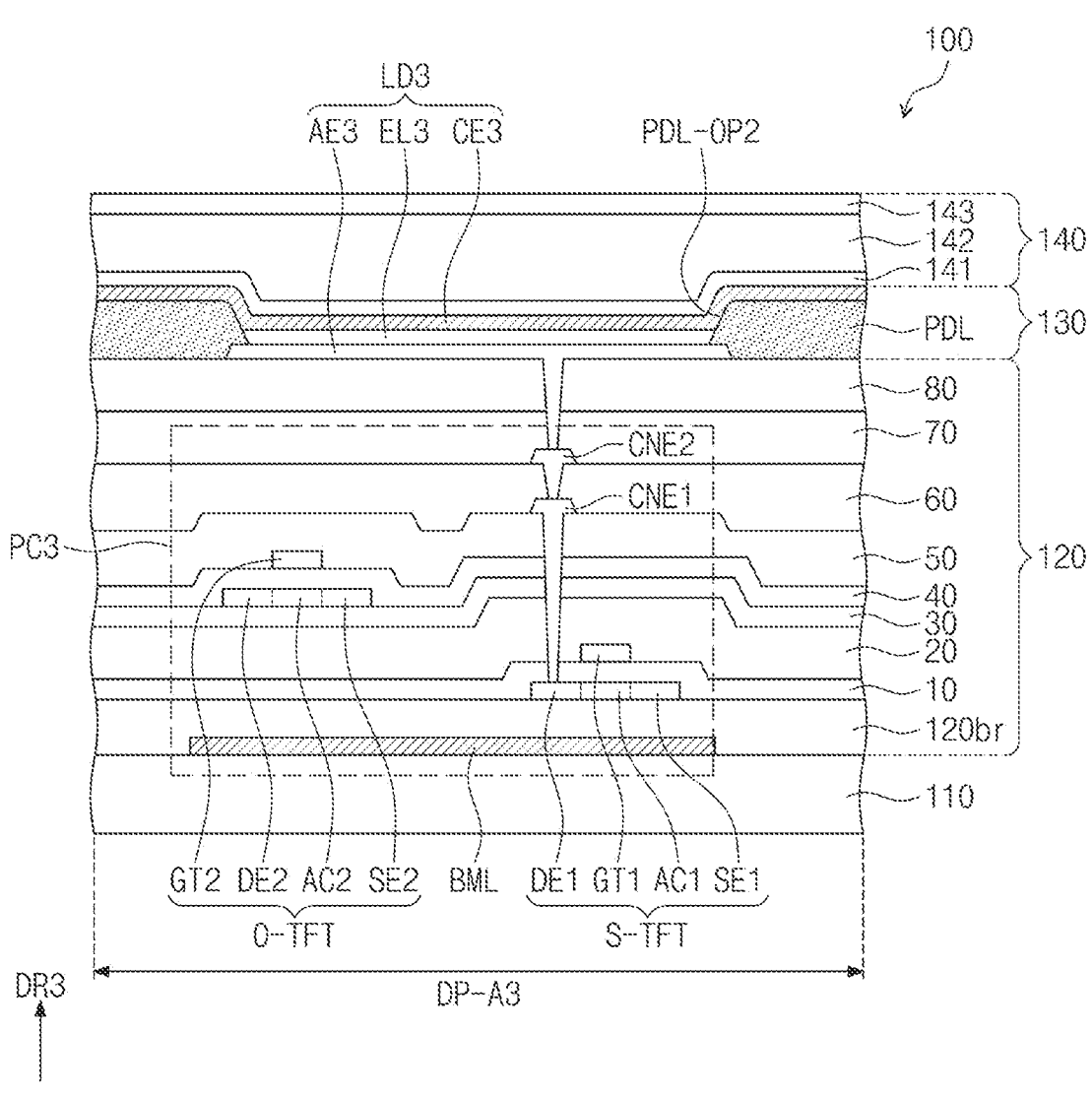
FIG. 7 is a cross-sectional view of a display panel according to an embodiment of the present disclosure.

The first, second, and third light-emitting elements LD1, LD2, and LD3 illustrated in FIG. 5 may respectively cor-respond to (e.g., may respectively show) the planar shapes of a first lower electrode AE1 of the first light-emitting element LD1, a second lower electrode AE2 of the second light-emitting element LD2 (e.g., see FIG. 8), and a third lower electrode AE3 of the third light-emitting element LD3 (e.g., see FIG. 7). An area of the first lower electrode AE1 may be larger than an area of the third lower electrode AE3 (e.g., see FIG. 5).

Figure 6:
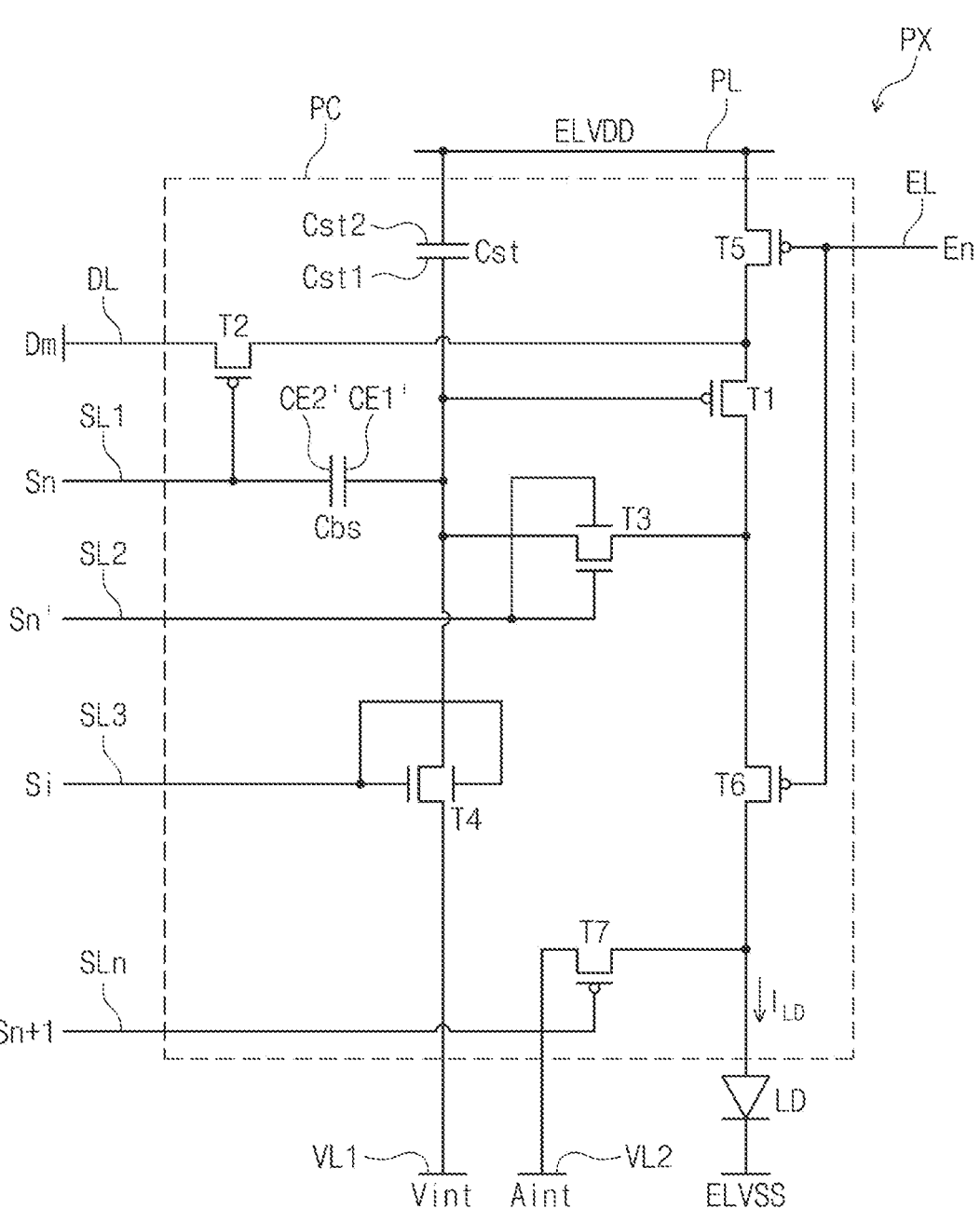
FIG. 6 is an equivalent circuit diagram of a pixel according to an embodiment of the present disclosure.

FIG. 6 is an equivalent circuit diagram of a pixel accord-ing to an embodiment of the present disclosure.

FIG. 6 illustrates an equivalent circuit diagram of one-pixel PX from among the plurality of pixels PX. The pixel PX illustrated in FIG. 6 may be a first pixel PX1, a second pixel PX2, or a third pixel PX3 (e.g., see FIG. 4). The pixel PX may include a light-emitting element LD and a pixel circuit PC. The light-emitting element LD may be included in the light-emitting element layer 130, and the pixel circuit PC may be included in the circuit layer 120 (e.g., see FIG. 3).

The pixel circuit PC may include a plurality of thin film transistors T1, T2, T3, T4, T5, T6, and T7, and a storage capacitor Cst. The plurality of thin film transistors T1, T2, T3, T4, T5, T6, and T7 and the storage capacitor Cst may be electrically connected to signal lines SL1, SL2, SL3, SLn, EL, and DL, a first initialization voltage line VL1, a second initialization voltage line VL2 (e.g., an anode initialization voltage line), and a driving voltage line PL. In an embodi-ment, at least one of the above-described lines, for example, such as the driving voltage line PL, may be shared by neighboring (e.g., adjacent) pixels PX.

The plurality of thin film transistors T1, T2, T3, T4, T5, T6, and T7 may include a driving thin film transistor T1, a switching thin film transistor T2, a compensation thin film transistor T3, a first initialization thin film transistor T4, an operation control thin film transistor T5, a light emission control thin film transistor T6, and a second initialization thin film transistor T7.

The light-emitting element LD may include a lower electrode (for example, an anode electrode or a pixel elec-trode) and an upper electrode (for example, a cathode electrode or a common electrode). The lower electrode of the light-emitting element LD is connected to the driving thin film transistor T1 via the light emission control thin film transistor T6 to receive a driving current ILD. The upper electrode of the light-emitting element LD may receive a low power supply voltage ELVSS. The light-emitting ele-ment LD may generate light having a desired luminance corresponding to the driving current ILD.

Some of the plurality of thin film transistors T1, T2, T3, T4, T5, T6, and T7 may be provided as an n-channel MOSFET (NMOS), and the rest (e.g., the others) of the thin film transistors may be provided as a p-channel MOSFET (PMOS). For example, from among the plurality of thin film transistors T1, T2, T3, T4, T5, T6, and T7, the compensation thin film transistor T3 and the first initialization thin film transistor T4 may be provided as NMOS (n-channel MOS-FETs), and the rest (e.g., the others) of the thin film transistors may be provided as PMOS (p-channel MOS-FETs), but the present disclosure is not limited thereto.

In another embodiment, from among the plurality of thin film transistors T1, T2, T3, T4, T5, T6, and T7, the com-pensation thin film transistor T3, the first initialization thin film transistor T4, and second initialization thin film tran-sistor T7 may be provided as NMOS, and the rest (e.g., the others) of the thin film transistors may be provided as PMOS. As another example, only one of the plurality of thin film transistors T1, T2, T3, T4, T5, T6, and T7 may be provided as an NMOS, and the rest (e.g., the others) of the thin film transistors may be provided as a PMOS. As another example, all the plurality of thin film transistors T1, T2, T3, T4, T5, T6, and T7 may be provided as NMOS or PMOS.

The signal lines may include a first scan line SL1 that transmits a first scan signal Sn, a second scan line SL2 that transmits a second scan signal Sn', a previous scan line SL3 that transmits a third scan signal S1 to the first initialization thin film transistor T4, a light emission control line EL that transmits a light emission control signal En to the operation control thin film transistor T5 and the light emission control thin film transistor T6, a next scan line SLn that transmits a next scan signal Sn+1 to the second initialization thin film transistor T7, and a data line DL that crosses the first scan line SL1 and transmits a data signal Dm, where n, i, and m are natural numbers. The first scan signal Sn may be a current scan signal, and the next scan signal Sn+1 may be a next scan signal of the first scan signal Sn.

The driving voltage line PL may transmit a driving voltage ELVDD to the driving thin film transistor T1, the first initialization voltage line VL1 may transmit an initialization voltage Vint for initializing the driving thin film transistor T1, and the second initialization voltage line VL2 may transmit an anode initialization voltage Aint for initializing the pixel electrode.

A driving gate electrode of the driving thin film transistor T1 may be connected to the storage capacitor Cst, a drive source region of the driving thin film transistor T1 may be connected to the driving voltage line PL via the operation control thin film transistor T5, and a drive drain region of the driving thin film transistor T1 may be electrically connected to the first electrode of the light-emitting element LD via the light emission control thin film transistor T6. The driving thin film transistor T1 may receive a data signal Dm in response to a switching operation of the switching thin film transistor T2, and may supply the driving current ILD to the light-emitting element LD.

A switching gate electrode of the switching thin film transistor T2 may be connected to the first scan line SL1 that transmits the first scan signal Sn, a switching source region of the switching thin film transistor T2 may be connected to the data line DL, and a switching drain region of the switching thin film transistor T2 may be connected to the driving voltage line PL via the operation control thin film transistor T5 and to the drive source region of the driving thin film transistor T1. The switching thin film transistor T2 may be turned on in response to the first scan signal Sn received through the first scan line SL1 to perform the switching operation to transmit the data signal Dm transmitted to the data line DL to the drive source region of the driving thin film transistor T1.

A compensation gate electrode of the compensation thin film transistor T3 is connected to the second scan line SL2. A compensation drain region of the compensation thin film transistor T3 may be connected to the pixel electrode of the light-emitting element LD via the light emission control thin film transistor T6 and to the drive drain region of driving thin film transistor T1. A compensation source region of the compensation thin film transistor T3 may be connected to a first electrode Cst1 of the storage capacitor Cst and to the driving gate electrode of the driving thin film transistor T1. In addition, the compensation source region may be connected to a first initialization drain region of the first initialization thin film transistor T4.

The compensation thin film transistor T3 may be turned on in response to the second scan signal Sn' received through the second scan line SL2, and may electrically connect the driving gate electrode and the drive drain region of the driving thin film transistor T1 to each other to make the driving thin film transistor T1 diode-connected.

A first initialization gate electrode of the first initialization thin film transistor T4 may be connected to the previous scan line SL3. A first initialization source region of the first initialization thin film transistor T4 may be connected to the first initialization voltage line VL1. The first initialization drain region of the first initialization thin film transistor T4 may be connected to the first electrode Cst1 of the storage capacitor Cst, the compensation source region of the compensation thin film transistor T3, and the driving gate electrode of the driving thin film transistor T1. The initialization thin film transistor T4 may be turned on in response to the third scan signal Si received through the previous scan line SL3, and may transmit the initialization voltage Vint to the driving gate electrode of the driving thin film transistor T1, thereby performing an initialization operation for initializing the voltage of the driving gate electrode of the driving thin film transistor T1.

An operation control gate electrode of the operation control thin film transistor T5 may be connected to the light emission control line EL, an operation control source region of the operation control thin film transistor T5 may be connected to the driving voltage line PL, and an operation control drain region of the operation control thin film transistor T5 may be connected to the drive source region of the driving thin film transistor T1 and the switching drain region of the switching thin film transistor T2.

A light emission control gate electrode of the light emission control thin film transistor T6 may be connected to the light emission control line EL, a light emission control source region of the light emission control thin film transistor T6 may be connected to the drive drain region of driving thin film transistor T1 and the compensation drain region of the compensation thin film transistor T3, and the light emission control drain region of the light emission control thin film transistor T6 may be electrically connected to a second initialization drain region of the second initialization thin film transistor T7 and the pixel electrode of the light-emitting element LD.

The operation control thin film transistor T5 and the light emission control thin film transistor T6 are concurrently (e.g., simultaneously) turned on in response to the light emission control signal En received through the light emission control line EL, so that the driving voltage ELVDD is transmitted to the light-emitting element LD and the driving current ILD flows through the light-emitting element LD.

A second initialization gate electrode of the second initialization thin film transistor T7 may be connected to the next scan line SLn, the second initialization drain region of the second initialization thin film transistor T7 may be connected to the light emission control drain region of the light emission control thin film transistor T6 and the pixel electrode of light-emitting element LD, and a second initialization source region of the second initialization thin film transistor T7 may be connected to the second initialization voltage line VL2 to receive the anode initialization voltage Aint. The second initialization thin film transistor T7 is turned on in response to the next scan signal Sn+1 received through the next scan line SLn to initialize the pixel electrode of the light-emitting element LD.

In another embodiment, the second initialization thin film transistor T7 may be connected to the light emission control line EL, and may be driven in response to the light emission control signal En. The positions of the source regions and the drain regions of a corresponding transistor described above may be variously modified depending on the type (e.g., p-type or n-type) of the corresponding transistor.

The storage capacitor Cst may include the first electrode Cst1 and a second electrode Cst2. The first electrode Cst1 of the storage capacitor Cst is connected to the driving gate electrode of the driving thin film transistor T1, and the second electrode Cst2 of the storage capacitor Cst is connected to the driving voltage line PL. A charge corresponding to a difference between a voltage of the driving gate electrode of the driving thin film transistor T1 and the driving voltage ELVDD may be stored in the storage capacitor Cst.

A boosting capacitor Cbs may be connected between the storage capacitor Cst and the first scan line SL1. The boosting capacitor Cbs may include a first electrode CE1' and a second electrode CE2'. The first electrode CE1' of the boosting capacitor Cbs may be connected to the first electrode Cst1 of the storage capacitor Cst, and the second electrode CE2' of the boosting capacitor Cbs may receive the first scan signal Sn. The boosting capacitor Cbs may compensate for a voltage drop of the gate terminal (e.g., the driving gate electrode) of the driving thin film transistor T1 by increasing the voltage at the gate terminal of the driving thin film transistor T1 at a point in time when the supply of the first scan signal Sn is stopped.

A detailed operation of each pixel PX according to an embodiment is described in more detail hereinafter.

During an initialization period, when the third scan signal Si is supplied through the previous scan line SL3, the first initialization thin film transistor T4 is turned on in response to the third scan signal Si, and the driving thin film transistor T1 is initialized by the initialization voltage Vint supplied from the first initialization voltage line VL1.

During a data programming period, when the first scan signal Sn and the second scan signal Sn' are supplied through the first scan line SL1 and the second scan line SL2, the switching thin film transistor T2 and the compensation thin film transistor T3 are turned on in response to the first scan signal Sn and the second scan signal Sn'. At this time, the driving thin film transistor T1 is diode-connected by the turned-on compensation thin film transistor T3, and is forward biased.

Then, a compensation voltage (e.g., Dm+Vth, where Vth is a negative (−) value), which becomes lower than the data signal Dm supplied from the data line DL by a threshold voltage (Vth) of the driving thin film transistor T1, is applied to the driving gate electrode of the driving thin film transistor T1.

The driving voltage ELVDD and the compensation voltage Dm+Vth are applied to opposite ends of the storage capacitor Cst, and a charge corresponding to the voltage difference between the opposite ends is stored in the storage capacitor Cst.

During a light emission period, the operation control thin film transistor T5 and the light emission control thin film transistor T6 are turned on in response to the light emission control signal En supplied from the light emission control line EL. The driving current ILD is generated according to a voltage difference between the voltage of the driving gate electrode of the driving thin film transistor T1 and the driving voltage ELVDD, and the driving current ILD is supplied to the light-emitting element LD through the light emission control thin film transistor T6.

In the present embodiment, at least one of the plurality of thin film transistors T1, T2, T3, T4, T5, T6, or T7 includes a semiconductor layer containing an oxide, and the rest (e.g., the others) of the thin film transistors include a semiconductor layer containing silicon.

In more detail, the driving thin film transistor T1 that directly affects the brightness of the display device may be configured to include a semiconductor layer including (e.g., made of) polycrystalline silicon having high reliability, thereby achieving a high-resolution display device.

Because an oxide semiconductor has high carrier mobility and low leakage current, the voltage drop may not be large even when a driving time is long. In other words, a color change of an image caused by the voltage drop may not be large, even during low-frequency driving, so that the low-frequency driving may be possible.

As such, because the oxide semiconductor may have the low leakage current, it may be possible to prevent or substantially prevent a leakage current from flowing to the driving gate electrode, and power consumption may be reduced by employing, as the oxide semiconductor, at least one of the compensation thin film transistor T3 connected to the driving gate electrode of driving thin film transistor T1, the first initialization thin film transistor T4, or the second initialization thin film transistor T7.

FIG. 7 is a cross-sectional view of a display panel according to an embodiment of the present disclosure. FIG. 8 is a cross-sectional view of a display panel according to an embodiment of the present disclosure. FIG. 7 is a cross-sectional view of a portion of the display panel 100 including a main display region DP-A3, and FIG. 8 is a cross-sectional view of a portion of the display panel 100 including a first display region DP-A1 and a second display region DP-A2.

Referring to FIGS. 7 and 8, the display panel 100 may include a plurality of insulating layers, a semiconductor pattern, a conductive pattern, and a signal line. An insulating layer, a semiconductor layer, and a conductive layer are formed by coating, vapor deposition, or the like. Thereafter, the insulating layer, the semiconductor layer, and the conductive layer may be selectively patterned by a photolithographic method. Accordingly, the semiconductor pattern, the conductive pattern, the signal line, and the like included in the circuit layer 120 and the light-emitting element layer 130 are formed. Thereafter, the encapsulation layer 140 that covers the light-emitting element layer 130 may be formed.

FIG. 7 illustrates a silicon thin film transistor S-TFT and an oxide thin film transistor O-TFT from among the thin film transistors in the third pixel circuit PC3 (e.g., see FIG. 5), and the third pixel circuit PC3 is connected to the third light-emitting element LD3. FIG. 8 illustrates the first light-emitting element LD1, the first pixel circuit PC1, the second light-emitting element LD2, and the second pixel circuit PC2.

A buffer layer 120br may be disposed on the base layer 110. The buffer layer 120br may prevent or substantially prevent diffusion of metal atoms or impurities from the base layer 110 into a first semiconductor pattern. In addition, the buffer layer 120br may allow the first semiconductor pattern to be uniformly or substantially uniformly formed by adjusting a heat supply rate during a crystallization process for pattering the first semiconductor pattern.

A back metal layer BML may be disposed between the base layer 110 and the buffer layer 120br. The back metal layer BML may be disposed to overlap with the first to third pixel circuits PC1, PC2, and PC3 to protect the first to third pixel circuits PC1, PC2, and PC3. The back metal layer BML may block external light from reaching the first to third pixel circuits PC1, PC2, and PC3. In addition, the back metal layer BML may block a laser used for etching in a subsequent process from reaching the first to third pixel circuits PC1, PC2, and PC3. The back metal layer BML may be formed to correspond to an entirety or substantially an entirety of the display region DP-A (e.g., see FIG. 4), and may include a corresponding hole in a region corresponding to the first display region DP-A1. In other words, the back metal layer BML may not overlap with the first display region DP-A1. The back metal layer BML may include, for example, molybdenum (Mo), titanium (Ti), aluminum (Al), silver (Ag), copper (Gu), or the like. However, the present disclosure is not limited thereto, and in another embodiment, the back metal layer BML may be omitted as needed or desired.

The first semiconductor pattern may be disposed on the buffer layer 120br. The first semiconductor pattern may include a silicon semiconductor. For example, the silicon semiconductor may include amorphous silicon, polycrystalline silicon, and/or the like. For example, the first semiconductor pattern may include low-temperature polysilicon.

FIG. 7 illustrates only a portion of the first semiconductor pattern disposed on the buffer layer 120br. For example, the first semiconductor pattern may be further disposed at (e.g., in or on) another region. The first semiconductor pattern may be arranged across the pixels according to a specific rule. The first semiconductor pattern may have different electrical properties depending on whether the semiconductor is doped or not. The first semiconductor pattern may include a first region having high conductivity, and a second region having low conductivity. The first region may be doped with an N-type dopant or a P-type dopant. A P-type transistor may include a doped region that is doped with the P-type dopant, and an N-type transistor may include a doped region that is doped with the N-type dopant. The second region may be an undoped region, or a region that is doped at a concentration lower than that of the first region.

The conductivity of the first region is greater than that of the second region, and the first region may serve or substantially serve as an electrode or a signal line. The second region may correspond to or substantially correspond to an active region (e.g., a channel) of the transistor. In other words, a portion of the semiconductor pattern may be an active region of the transistor, another portion may be a source or drain of the transistor, and another portion may be a connection electrode or a connection signal line.

For example, as shown in FIG. 7, a source region SE1, an active region AC1, and a drain region DE1 of the silicon thin film transistor S-TFT may be formed from the first semiconductor pattern. The source region SE1 and the drain region DE1 may extend in opposite directions from the active region AC1 on a cross-sectional view.

A first insulating layer 10 may be disposed on the buffer layer 120br. The first insulating layer 10 may overlap with the plurality of pixels in common, and may cover the first semiconductor pattern. The first insulating layer 10 may be an inorganic layer and/or an organic layer, and may have a single-layer or a multi-layered structure. The first insulating layer 10 may include at least one of aluminum oxide, titanium oxide, silicon oxide, silicon nitride, silicon oxynitride, zirconium oxide, or hafnium oxide. In the present embodiment, the first insulating layer 10 may be a single-layer silicon oxide layer. In addition to the first insulating layer 10, an insulating layer of the circuit layer 120, which will be described in more detail below, may be an inorganic layer and/or an organic layer, and may have a single-layer or a multi-layered structure. The inorganic layer may include at least one of the above-described materials, but the present disclosure is not limited thereto.

A gate GT1 of the silicon thin film transistor S-TFT is disposed on the first insulating layer 10. The gate GT1 may be a portion of a metal pattern. The gate GT1 overlaps with the active region AC1. In a process of doping the first semiconductor pattern, the gate GT1 may function as a mask. The gate GT1 may include titanium (Ti), silver (Ag), a silver-containing alloy, molybdenum (Mo), a molybdenum-containing alloy, aluminum (Al), an aluminum-containing alloy, aluminum nitride (AlN), tungsten (W), tungsten nitride (WN), copper (Cu), indium tin oxide (ITO), indium zinc oxide (IZO), and/or the like.

A second insulating layer 20 may be disposed on the first insulating layer 10, and may cover the gate GT1. The second insulating layer 20 may be an inorganic layer and/or an organic layer, and may have a single-layer or a multi-layered structure. The second insulating layer 20 may include at least one of silicon oxide, silicon nitride, or silicon oxynitride. In the present embodiment, the second insulating layer 20 may have a multilayered structure including a silicon oxide layer and a silicon nitride layer.

A third insulating layer 30 may be disposed on the second insulating layer 20. The third insulating layer 30 may have a single-layer or a multi-layered structure. For example, the third insulating layer 30 may have a multilayered structure including a silicon oxide layer and a silicon nitride layer. The second electrode Cst2 of the storage capacitor Cst (e.g., see FIG. 6) may be disposed between the second insulating layer 20 and the third insulating layer 30. In addition, the first electrode Cst1 of the storage capacitor Cst (e.g., see FIG. 6) may be disposed between the first insulating layer 10 and the second insulating layer 20.

The second semiconductor pattern may be disposed on the third insulating layer 30. The second semiconductor pattern may include an oxide semiconductor. A source region SE2, an active region AC2, and a drain region DE2 of the oxide thin film transistor O-TFT may be formed from the second semiconductor pattern. The source region SE2 and the drain region DE2 may extend in opposite directions from the active region AC2 on a cross-sectional view.

A fourth insulating layer 40 may be disposed on the third insulating layer 30. The fourth insulating layer 40 may overlap with the plurality of pixels in common, and may cover the second semiconductor pattern. The fourth insulating layer 40 may include at least one of aluminum oxide, titanium oxide, silicon oxide, silicon nitride, silicon oxynitride, zirconium oxide, or hafnium oxide.

A gate GT2 of the oxide thin film transistor O-TFT is disposed on the fourth insulating layer 40. The gate GT2 may be a portion of the metal pattern. The gate GT2 overlaps with the active region AC2. In a process of doping the second semiconductor pattern, the gate GT2 may function as a mask.

A fifth insulating layer 50 may be disposed on the fourth insulating layer 40, and may cover the gate GT2. The fifth insulating layer 50 may be an inorganic layer and/or an organic layer, and may have a single-layer or a multi-layered structure.

A first connection electrode CNE1 may be disposed on the fifth insulating layer 50. The first connection electrode CNE1 may be connected to the drain region DE1 of the silicon thin film transistor S-TFT through a contact hole passing through (e.g., penetrating) the first to fifth insulating layers 10, 20, 30, 40, and 50.

A sixth insulating layer 60 may be disposed on the fifth insulating layer 50. A second connection electrode CNE2 may be disposed on the sixth insulating layer 60.

The second connection electrode CNE2 may be connected to the first connection electrode CNE1 through a contact hole passing through (e.g., penetrating) the sixth insulating layer 60. A seventh insulating layer 70 may be disposed on the sixth insulating layer 60, and may cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include benzocyclobutene (BCB), polyimide, hexamethyldisiloxane (HMDSO), general-purpose polymers, for example, such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, p-xylene-based polymer, vinyl alcohol-based polymer, and/or the like, or blends thereof.

The light-emitting element layer 130 including the first to third light-emitting elements LD1, LD2, and LD3 may be disposed on the circuit layer 120. The first light-emitting element LD1 may include a first lower electrode AE1, a first light-emitting layer EL1, and a first upper electrode CE1. The second light-emitting element LD2 may include a second lower electrode AE2, a second light-emitting layer EL2, and a second upper electrode CE2. The third light-emitting element LD3 may include a third lower electrode AE3, a third light-emitting layer EL3, and a third upper electrode CE3.

The first lower electrode AE1, the second lower electrode AE2, and the third lower electrode AE3 may be disposed on the eighth insulating layer 80. Each of the first lower electrode AE1, the second lower electrode AE2, and the third lower electrode AE3 may be a transflective electrode or a reflective electrode. In an embodiment, each of the first lower electrode AE1, the second lower electrode AE2, and the third lower electrode AE3 may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In$_2$O$_3$), and aluminum doped zinc oxide (AZO). For example, each of the first lower electrode AE1, the second lower electrode AE2, and the third lower electrode AE3 may have a three-layered structure of ITO/Ag/ITO.

A pixel defining layer PDL and a pixel defining pattern PDP may be disposed on the eighth insulating layer 80. The pixel defining layer PDL and the pixel defining pattern PDP may include the same material as each other, and may be formed through the same process. Each of the pixel defining layer PDL and the pixel defining pattern PDP may have a property of absorbing light. For example, each of the pixel defining layer PDL and the pixel defining pattern PDP may have a black color. Each of the pixel defining layer PDL and the pixel defining pattern PDP may include a black coloring agent. The black coloring agent may include a black dye and a black pigment. The black coloring agent may include carbon black, a metal such as chromium, or an oxide thereof.

The pixel defining pattern PDP may be disposed at (e.g., in or on) the first display region DP-A1. The pixel defining pattern PDP may cover a portion of the first lower electrode AE1. For example, the pixel defining pattern PDP may cover an edge of the first lower electrode AE1. The pixel defining pattern PDP may have a ring shape when viewed from the thickness direction (e.g., when viewed from the third direction DR3 or in a plan view) of the display panel 100. However, the present disclosure is not limited thereto, and for example, the pixel defining pattern PDP may have a rhombus shape or a rectangular shape when viewed from the third direction DR3 (e.g., in the plan view).

The pixel defining layer PDL may be disposed at (e.g., in or on) the second display region DP-A2 and the main display region DP-A3. The pixel defining layer PDL may cover a portion of each of the second lower electrode AE2 and the third lower electrode AE3. For example, a first opening PDL-OP1, which exposes a portion of the second lower electrode AE2, and a second opening PDL-OP2, which exposes a portion of the third lower electrode AE3, may be defined in the pixel defining layer PDL.

The pixel defining pattern PDP may increase a distance between the edge of the first lower electrode AE1 and the first upper electrode CE1, and the pixel defining layer PDL may increase distances between edges of the second and third lower electrodes AE2 and AE3 and the second and third upper electrodes CE2 and CE3, respectively. Accordingly, the pixel defining pattern PDP and the pixel-defining layer PDL may serve to prevent or substantially prevent an arc from occurring at the edges of each of the first, second, and third lower electrodes AE1, AE2, and AE3.

A region of the first display region DP-A1 overlapping with a portion where the first lower electrode AE1 and the pixel defining pattern PDP are disposed is defined as an element region DA, and the remaining regions of the first display region DP-A1 may be defined as a transmission region TA.

The first lower electrode AE1 may be electrically connected to the first pixel circuit PC1 disposed at (e.g., in or on) the second display region DP-A2. For example, the first lower electrode AE1 may be electrically connected to the first pixel circuit PC1 through a connection electrode CNE1', the connection wiring TWL, and a connection bridge CPN. In this case, the connection wiring TWL may overlap with the transmission region TA. Accordingly, the connection wiring TWL may include a light-transmitting material.

The connection wiring TWL may be disposed between the fifth insulating layer 50 and the sixth insulating layer 60, but is not particularly limited thereto. The connection bridge CPN may be disposed between the sixth insulating layer 60 and the seventh insulating layer 70. The connection bridge CPN may be connected to the connection wiring TWL and the first pixel circuit PC1. The connection electrode CNE1' may be connected to the first lower electrode AE1 and the connection wiring TWL.

The first light-emitting layer EL1 may be disposed on the first lower electrode AE1, the second light-emitting layer EL2 may be disposed on the second lower electrode AE2, and the third light-emitting layer EL3 may be disposed on the third lower electrode AE3. In the present embodiment, each of the first to third light-emitting layers EL1, EL2, and EL3 may emit light of at least one color of blue, red, or green.

The first upper electrode CE1, the second upper electrode CE2, and the third upper electrode CE3 may be disposed on the first to third light-emitting layers ELI, EL2, and EL3, respectively. The second upper electrode CE2 and the third upper electrode CE3 may be commonly disposed in the plurality of pixels PX (e.g., see FIG. 4). The second upper electrode CE2 is commonly disposed on the plurality of second pixels PX2, and the third upper electrode CE3 is commonly disposed on the plurality of third pixels PX3. The second upper electrode CE2 and the third upper electrode CE3 may be respectively formed in common on each of the second and third pixels PX2 and PX3 using an open mask.

A plurality of electrode openings CE1-OP may be defined in a portion of the first upper electrode CE1. Each of the plurality of electrode openings CE1-OP may be provided in a portion of the first upper electrode CE1 overlapping with the transmission region TA. Because a portion of the first upper electrode CE1 overlapping with the transmission region TA is removed, the light transmittance of the transmission region TA may be further improved. In an embodiment, the first upper electrode CE1 may be commonly formed on the plurality of first pixels PX1 using an open mask, and then a portion of the first upper electrode CE1 overlapping with the transmission region TA may be removed, thereby forming the plurality of electrode openings CE1-0P.

The first upper electrode CE1, the second upper electrode CE2, and the third upper electrode CE3 may be light-transmitting electrodes. In an embodiment, the first upper electrode CE1, the second upper electrode CE2, and the third upper electrode CE3 may be transparent or semi-transparent electrodes, and may include (e.g., may be formed of) a small-work-function metal thin film that includes Li, Ca, LiF/Ca, LiF/Al, Al, Ag, Mg, or a compound thereof. In addition, a transparent conductive oxide (TCO) layer, for example, such as ITO, IZO, ZnO, or $In_2O_3$, may be further disposed on the metal thin film.

In some embodiments, a capping layer that includes an organic material may be further formed on the first to third upper electrodes CE1, CE2, and CE3. The capping layer may be a layer provided to protect the first to third upper electrodes CE1, CE2, and CE3, and to increase light extraction efficiency. The capping layer may include an organic material having a refractive index higher than those of the first to third upper electrodes CE1, CE2, and CE3. As another example, the capping layer may be provided by stacking various layers having different refractive indices from one another. For example, the capping layer may be provided by stacking a high-refractive-index layer/low-refractive-index layer/high-refractive-index layer. In this case, the refractive index of the high-refractive-index layer may be about 1.7 or more, and the refractive index of the low-refractive-index layer may be about 1.3 or less. The capping layer may additionally include LiF. As another example, the capping layer may additionally include an inorganic insulating material, for example, such as silicon oxide (SiO2) or silicon nitride (SiNx).

In some embodiments, a hole control layer may be disposed between the first to third pixel electrodes AE1, AE2, and AE3 and the first to third light-emitting layers EL1, EL2, and EL3. The hole control layer may include a hole transport layer, and may further include a hole injection layer. An electron control layer may be disposed between the first to third light-emitting layers EL1, EL2, and EL3 and the first to third upper electrodes CE1, CE2, and CE3. The electron control layer may include an electron transport layer, and may further include an electron injection layer. The hole control layer and the electron control layer may be formed in common in the plurality of pixels PX (e.g., see FIG. 4) using an open mask.

The encapsulation layer 140 may be disposed on the light-emitting element layer 130. The encapsulation layer 140 may include an inorganic layer 141, an organic layer 142, and an inorganic layer 143 that are sequentially stacked, but the layers that constitute the encapsulation layer 140 are not limited thereto.

The inorganic layers 141 and 143 protect the light-emitting element layer 130 from moisture and oxygen, and the organic layer 142 may protect the light-emitting element layer 130 from foreign substances, for example, such as dust particles. The inorganic layers 141 and 143 may include a silicon nitride layer, a silicon oxynitride layer, a silicon oxide layer, a titanium oxide layer, an aluminum oxide layer, and/or the like. The organic layer 142 may include an acrylic organic layer, but the present disclosure is not limited thereto.

Figure 9:
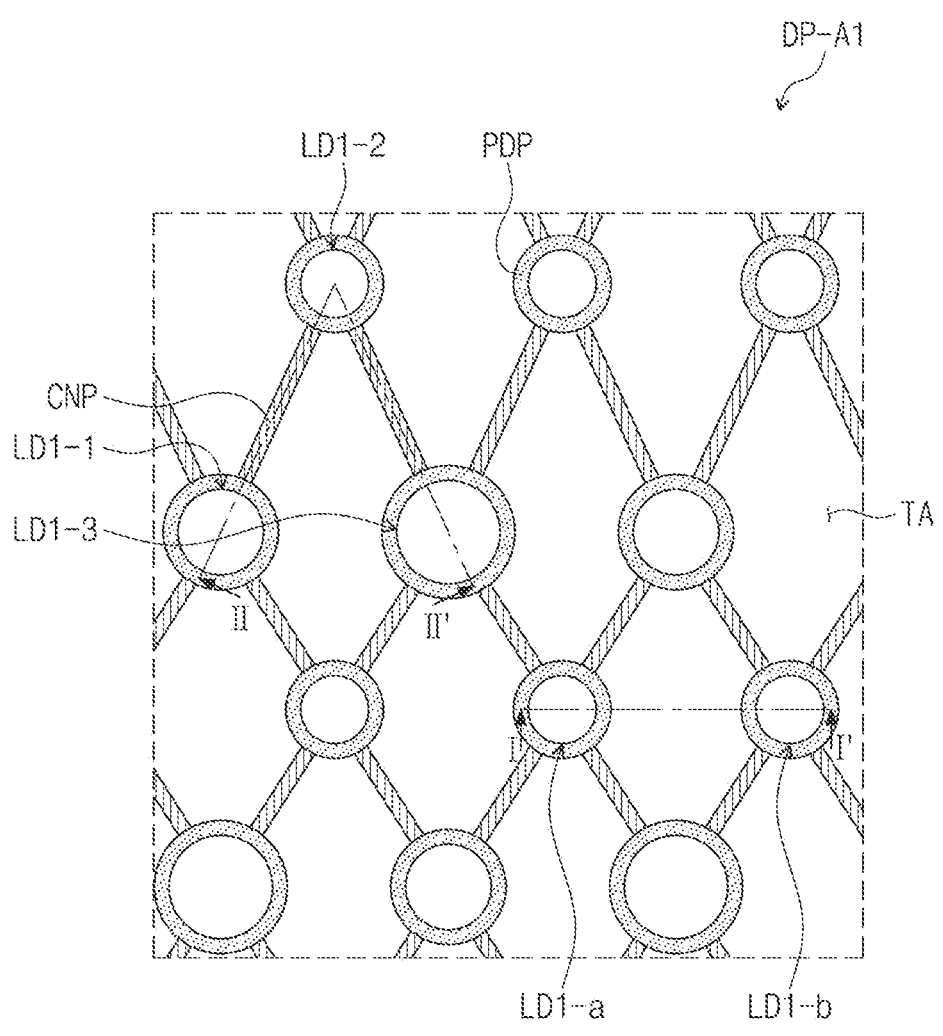
FIG. 9 is a plan view illustrating a portion of a display panel according to an embodiment of the present disclosure.
Figure 10:
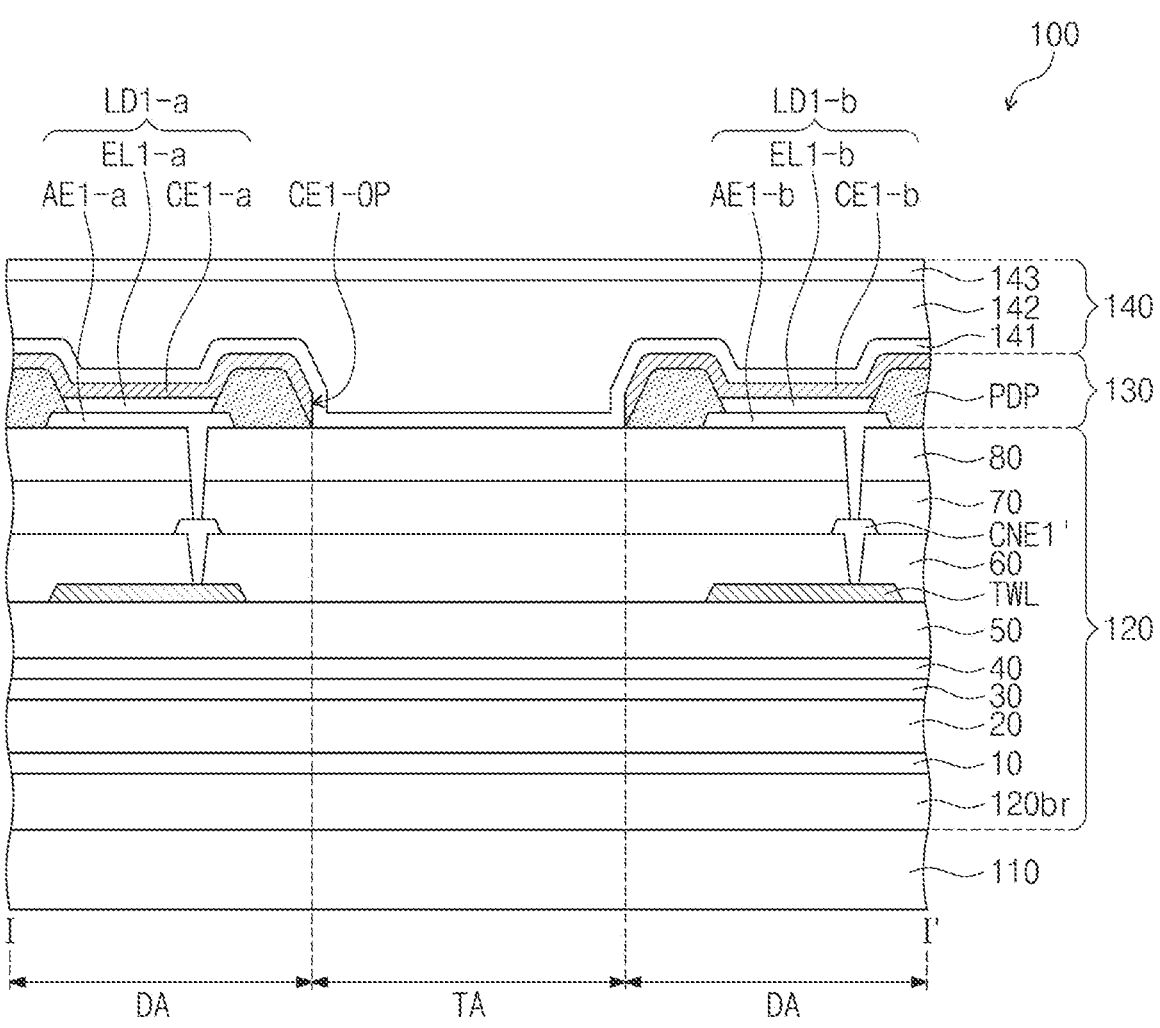
FIGS. 10-11 are cross-sectional views of a portion of a display panel according to an embodiment of the present disclosure.
Figure 11:
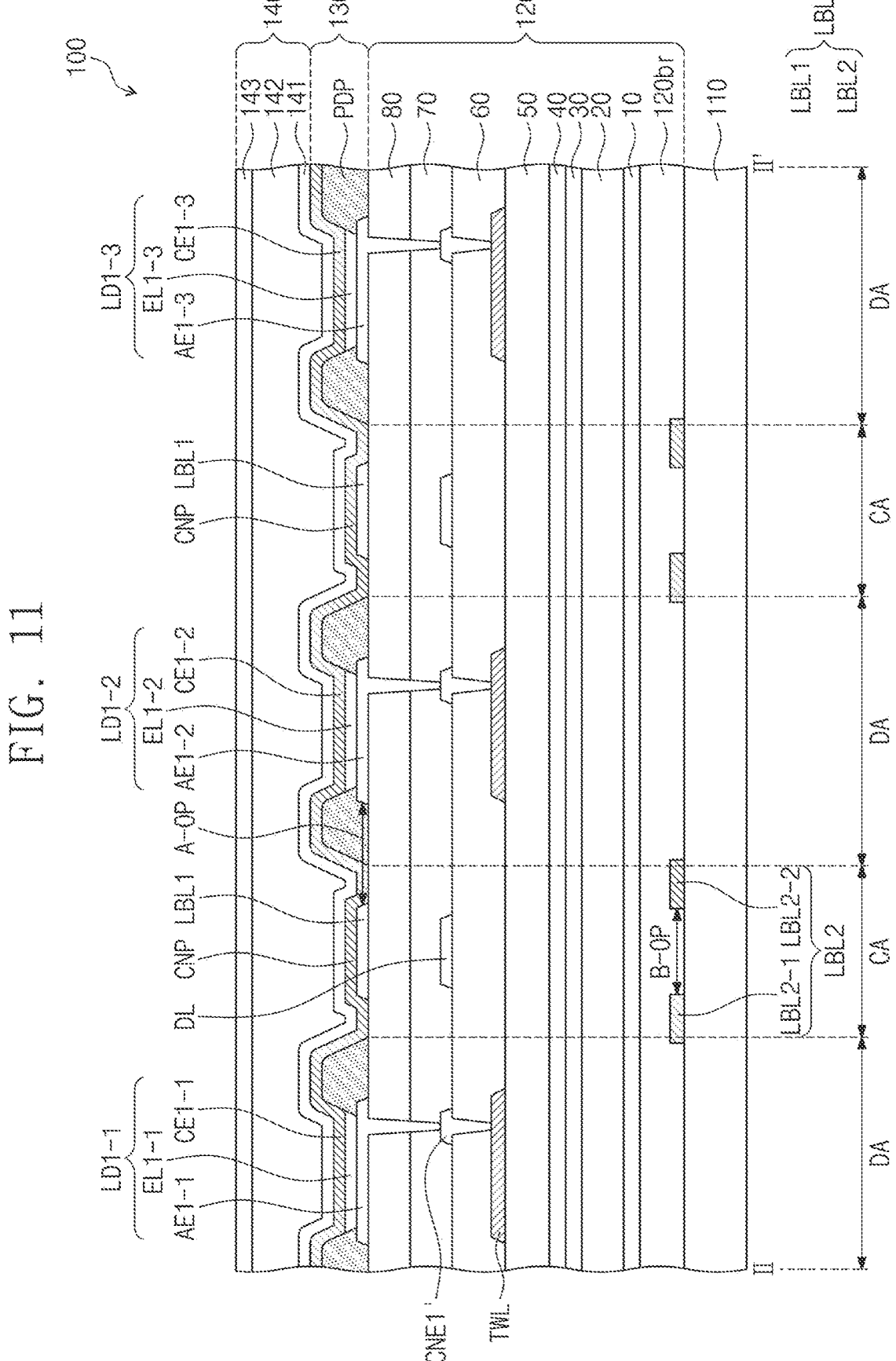

FIG. 9 is a plan view illustrating a portion of a display panel according to an embodiment of the present disclosure. FIGS. 10 and 11 are cross-sectional views of a portion of a display panel according to an embodiment of the present disclosure. FIG. 9 illustrates a portion of the first display region of the display panel according to an embodiment. FIG. 10 is a cross-sectional view taken along the line I-I' of FIG. 9. FIG. 11 is a cross-sectional view taken along the line II-II' of FIG. 9.

Referring to FIG. 9, a plurality of first light-emitting elements LD1-a, LD1-b, LD1-1, LD1-2, and LD1-3 may be disposed at (e.g., in or on) the first display region DP-A1 of the display panel according to an embodiment. Adjacent first light-emitting elements from among the plurality of first light-emitting elements may be connected to each other through a connection part CNP. In an embodiment, a 1-1st light-emitting element LD1-1 and a 1-2nd light-emitting element LD1-2 disposed adjacent to each other are connected to each other through the connection part CNP, and the 1-2nd light-emitting element LD1-2 and a 1-3rd light-emitting element LD1-3 disposed adjacent to each other may be connected to each other through the connection part CNP. FIG. 9 illustrates as an example that light-emitting elements that are adjacent to each other in a direction between the first direction DR1 and the second direction DR2, or in other words, the light-emitting elements disposed and adjacent to each other in a diagonal direction, are connected to each other through the connection part CNP. However, the present disclosure is not limited thereto, and light-emitting elements disposed adjacent to each other in the first direction DR1 or the second direction DR2 may be connected to each other through the connection part CNP. For example, in another embodiment, a 1-a-th light-emitting element LD1-a and a 1-b-th light-emitting element LD1-b may be connected to each other through the connection part CNP, and the 1-1st light-emitting element LD1-1 and the 1-3rd light-emitting element LD1-3 may be connected to each other through the connection part CNP.

Referring to FIGS. 9, 10, and 11 together, in the first display region DP-A1 of the display panel 100 according to an embodiment, each of the plurality of first light-emitting elements LD1-a, LD1-b, LD1-1, LD1-2, and LD1-3 may include a first lower electrode AE1-a, AE1-b, AE1-1, AE1-2, or AE1-3, a first light-emitting layer EL1-a, EL1-b, EL1-1, EL1-2, or EL1-3 disposed on the first lower electrode AE1-a, AE1-b, AE1-1, AE1-2, or AE1-3, and a first upper electrode CE1-a, CE1-b, CE1-1, CE1-2, or CE1-3 disposed on the first light-emitting layer EL1-a, EL1-b, EL1-1, EL1-2, or EL1-3. In the display panel according to an embodiment, a region in which each of the plurality of first light-emitting elements is disposed is defined as an element region DA, a region in which the connection part CNP is disposed is defined as a wiring region CA, and a region in which the first light-emitting element and the connection part CNP are not disposed may be defined as a transmission region TA.

A data line DL may be disposed at (e.g., in or on) the wiring region CA. FIG. 11 illustrates as an example that the data line DL is disposed between the sixth insulating layer 60 and the seventh insulating layer 70, but the present disclosure is not limited thereto, and the data line DL may be disposed on any suitable one of the plurality of insulating layers included in the circuit layer 120. The data line DL may include a transparent conductive oxide (TCO), for example, such as ITO, IZO, ZnO, or $In_2O_3$. The data line DL may be disposed to overlap with a first light blocking pattern LBL1 in a plan view, which will be described in more detail below.

Referring to FIGS. 9 and 10, a plurality of electrode openings CE1-OP may be defined in the first upper electrodes CE1-*a* and CE1-*b*. Each of the plurality of electrode openings CE1-OP may be provided in a portion of the first upper electrodes CE1-*a* and CE1-*b* overlapping with the transmission region TA between the element regions DA. In other words, because the first upper electrodes CE1-*a* and CE1-*b* are removed from the transmission region TA, the first upper electrodes CE1-*a* and CE1-*b* may not overlap with the transmission region TA between the element regions DA at (e.g., in or on) which two adjacent first light-emitting elements, such as the 1a-th light-emitting element LD1-*a* and the 1b-th light-emitting element LD1-*b*, are disposed. As the first upper electrodes CE1-*a* and CE1-*b* are removed from the portion overlapping with the transmission region TA, the light transmittance of the transmission region TA may be further improved.

Referring to FIGS. 9 and 11 together, in the first display region DP-A1 of the display panel 100 according to an embodiment, adjacent first light-emitting elements from among the plurality of first light-emitting elements LD1-1, LD1-2, and LD1-3 may be connected to each other through the connection part CNP. The connection part CNP may have a shape integrated with the first upper electrodes CE1-1, CE1-2, and CE1-3 included in the plurality of first light-emitting elements LD1-1, LD1-2, and LD1-3. In other words, the first upper electrodes CE1-1, CE1-2, and CE1-3 and the connection part CNP may be connected to each other, and may have an indistinguishable integrated shape. The first upper electrodes CE1-1, CE1-2, and CE1-3 and the connection part CNP may be formed through a single deposition process, and may include the same material as each other. For example, the first upper electrodes CE1-1, CE1-2, CE1-3 and the connection part CNP may be formed of a small-work-function metal thin film that includes Li, Ca, LiF/Ca, LiF/Al, Al, Ag, Mg, and/or a compound thereof.

The display panel 100 according to an embodiment further includes a light blocking pattern LBL disposed at (e.g., in or on) the wiring region CA. The light blocking pattern LBL includes a first light blocking pattern LBL1 and a second light blocking pattern LBL2. At least a portion of the light blocking pattern LBL is disposed to overlap with the connection part CNP in a plan view.

The first light blocking pattern LBL1 and at least a portion of the first light-emitting element LD1-1, LD1-2, and LD1-3 are disposed at (e.g., in or on) the same layer as each other. In an embodiment, the first light blocking pattern LBL1 and the first lower electrodes AE1-1, AE1-2, and AE1-3 may be disposed at (e.g., in or on) the same layer as each other. The first light blocking pattern LBL1 and the first lower electrodes AE1-1, AE1-2, and AE1-3 may be formed through the same process as each other. In other words, the first light blocking pattern LBL1 and the first lower electrodes AE1-1, AE1-2, and AE1-3 may be formed by forming a single layer through a deposition process, and then dividing the single layer into the first light blocking pattern LBL1 and the first lower electrodes AE1-1, AE1-2, and AE1-3 through a patterning process. The first light blocking pattern LBL1 and the first lower electrodes AE1-1, AE1-2, and AE1-3 may include the same material as each other. The first light blocking pattern LBL1 may include, for example, Ag, Mg, Al, Pt, Pd, Au, Ni, Nd, Ir, Cr, or a compound thereof.

The first light blocking pattern LBL1 may be disposed to be spaced apart from the first light-emitting elements LD1-1, LD1-2, and LD1-3 by a suitable distance (e.g., a predetermined distance). The first light blocking pattern LBL1 and the first lower electrodes AE1-1, AE1-2, and AE1-3 of the first light-emitting elements LD1-1, LD1-2, LD1-3 may be disposed at (e.g., in or on) the same layer as each other, and may be spaced apart from each other with a first gap A-OP between the first light blocking pattern LBL1 and adjacent ones of the first light-emitting elements LD1-1, LD1-2, LD1-3.

The second light blocking pattern LBL2 is disposed under (e.g., underneath) the layer at (e.g., in or on) which the first light blocking pattern LBL1 is disposed. The second light blocking pattern LBL2 may be disposed on, for example, the base layer 110. The second light blocking pattern LBL2 may be disposed on the base layer 110, and the second light blocking pattern LBL2 and the back metal layer BML (e.g., see FIGS. 7 and 8) may be formed through the same process as each other. The second light blocking pattern LBL2 and the back metal layer BML (e.g., see FIGS. 7 and 8) may include the same material as each other. The second light blocking pattern LBL2 may include, for example, molybdenum (Mo), titanium (Ti), aluminum (Al), silver (Ag), copper (Gu), and/or the like.

The second light blocking pattern LBL2 may have a thickness of about 100 nm to about 500 nm. When the thickness of the second light blocking pattern LBL2 is less than about 100 nm, the function of blocking the incident infrared laser may not be suitably performed. When the thickness of the second light blocking pattern LBL2 is greater than about 500 nm, the total thickness of the display panel may be excessively increased.

FIG. 11 illustrates as an example that the second light blocking pattern LBL2 is disposed on the base layer 110, but the present disclosure is not limited thereto, and the second light blocking pattern LBL2 may be disposed at (e.g., in or on) any suitable one of the plurality of layers that are disposed on the base layer 110. For example, the second light blocking pattern LBL2 may be disposed on the buffer layer 120*br*. As another example, the second light blocking pattern LBL2 may be disposed at (e.g., in or on) any suitable one of the first to sixth insulating layers 10, 20, 30, 40, 50, and 60.

At least a portion of the second light blocking pattern LBL2 is disposed to overlap with the first gap A-OP between the first light blocking pattern LBL1 and the adjacent ones of the first light-emitting elements LD1-1, LD1-2, LD1-3 (e.g., which may be defined by separating (e.g., by spacing apart) the first light blocking pattern LBL1 from the adjacent ones of the first light-emitting elements LD1-1, LD1-2, and LD1-3 on a plane (e.g., in a plan view). A portion of the second light blocking pattern LBL2 may be disposed to overlap with the first light blocking pattern LBL1 in a plan view. A portion of the second light blocking pattern LBL2 may also be disposed to overlap with the element region DA adjacent to the wiring region CA.

The second light blocking pattern LBL2 may include two subblocking patterns that are spaced apart from each other on a plane (e.g., in a plan view). In an embodiment, the second light blocking pattern LBL2 may include a first sub blocking pattern LBL2-1 and a second sub blocking pattern LBL2-2, and the first sub blocking pattern LBL2-1 and the second sub blocking pattern LBL2-2 may be disposed to be spaced apart from each other with a second gap B-OP therebetween.

At least a portion of the first light blocking pattern LBL1 may be disposed to overlap with the second gap B-OP, which may be defined by separating (e.g., by spacing apart) the first sub blocking pattern LBL2-1 from the second sub blocking pattern LBL2-2 on a plane (e.g., in a plan view).

In the display panel 100 according to an embodiment, the first light blocking pattern LBL1 and the second light blocking pattern LBL2 are disposed to complement each other. In more detail, at (e.g., in or on) the wiring region CA, a portion of the second light blocking pattern LBL2 is disposed at (e.g., in or on) a region where the first light blocking pattern LBL1 is not disposed, and a portion of the first light blocking pattern LBL1 is disposed at (e.g., in or on) a region where the second light blocking pattern LBL2 is not disposed. Accordingly, the light blocking pattern LBL may be disposed to completely (e.g., to entirely) overlap with the wiring region CA.

The display panel included in a display device according to one or more embodiments includes a connection part to which a plurality of light-emitting elements are connected, and a light blocking pattern disposed to overlap with the connection part on a plane (e.g., in a plan view). In the display panel according to one or more embodiments, the light blocking pattern includes a first light blocking pattern disposed at (e.g., in or on) a layer at (e.g., in or on) which a light-emitting element is disposed, and a second light blocking pattern disposed under (e.g., underneath) the first light blocking pattern. The first light blocking pattern and the second light blocking pattern may be disposed to complement each other. Accordingly, the light blocking pattern may prevent or substantially prevent a portion of the connection part from being removed due to the laser emitted in the process of patterning the upper electrode of the light-emitting element, or may prevent or substantially prevent a defect such as a burr occurring in the connection part or the upper electrode adjacent thereto, whereby the reliability of the display panel and display device including same may be improved.

Figure 12A:
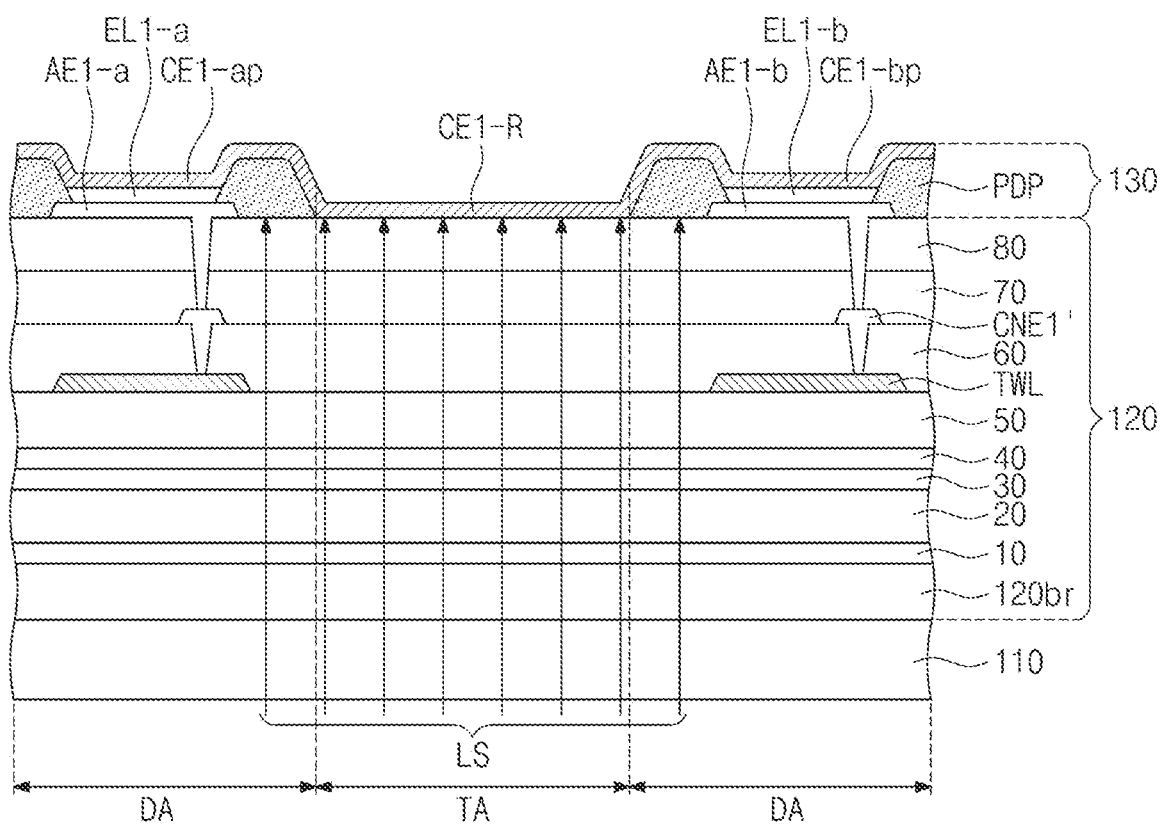
FIGS. 12A-12B are cross-sectional views of some operations of a method of manufacturing a display panel according to an embodiment of the present disclosure.
Figure 12B:
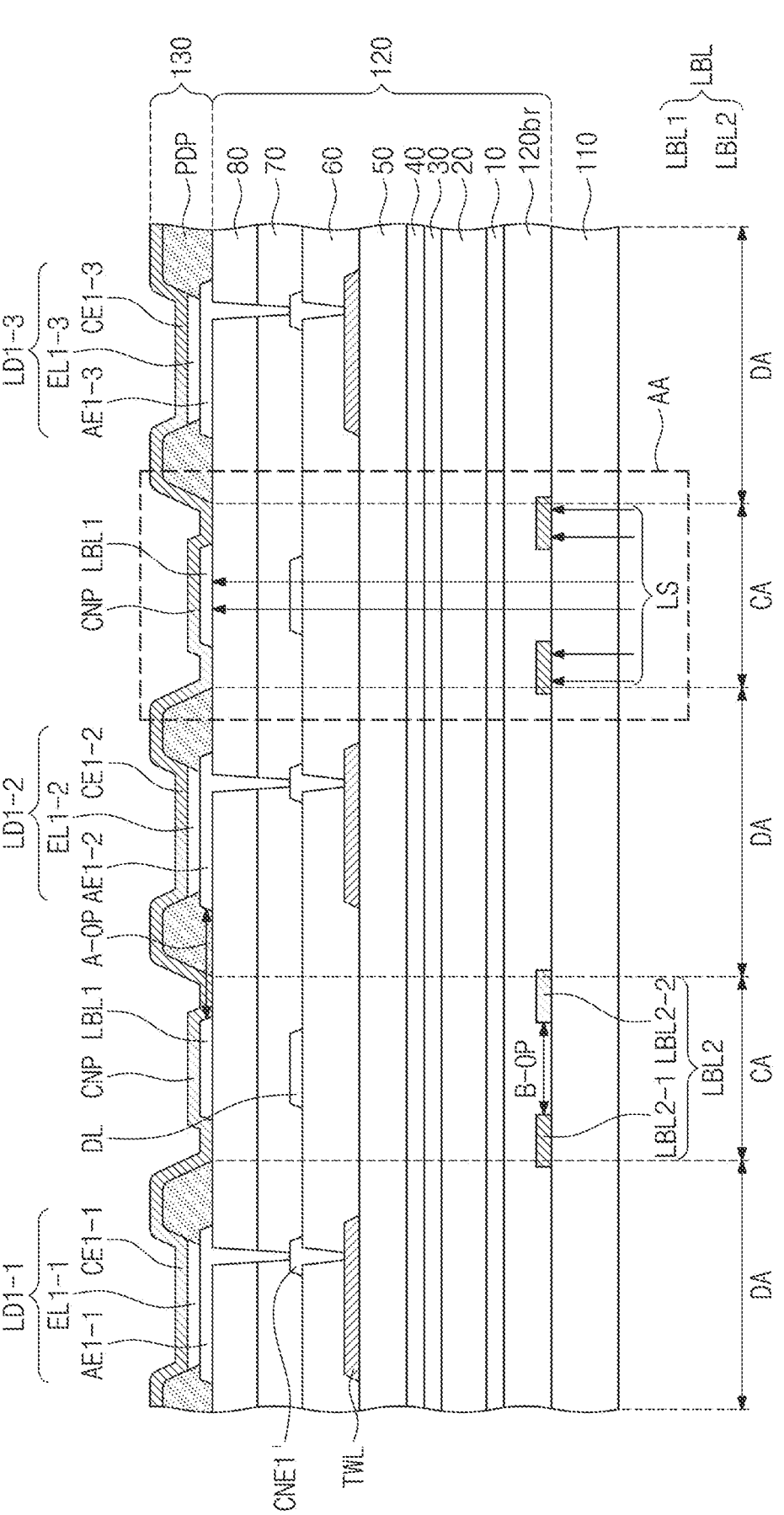
Figure 13A:
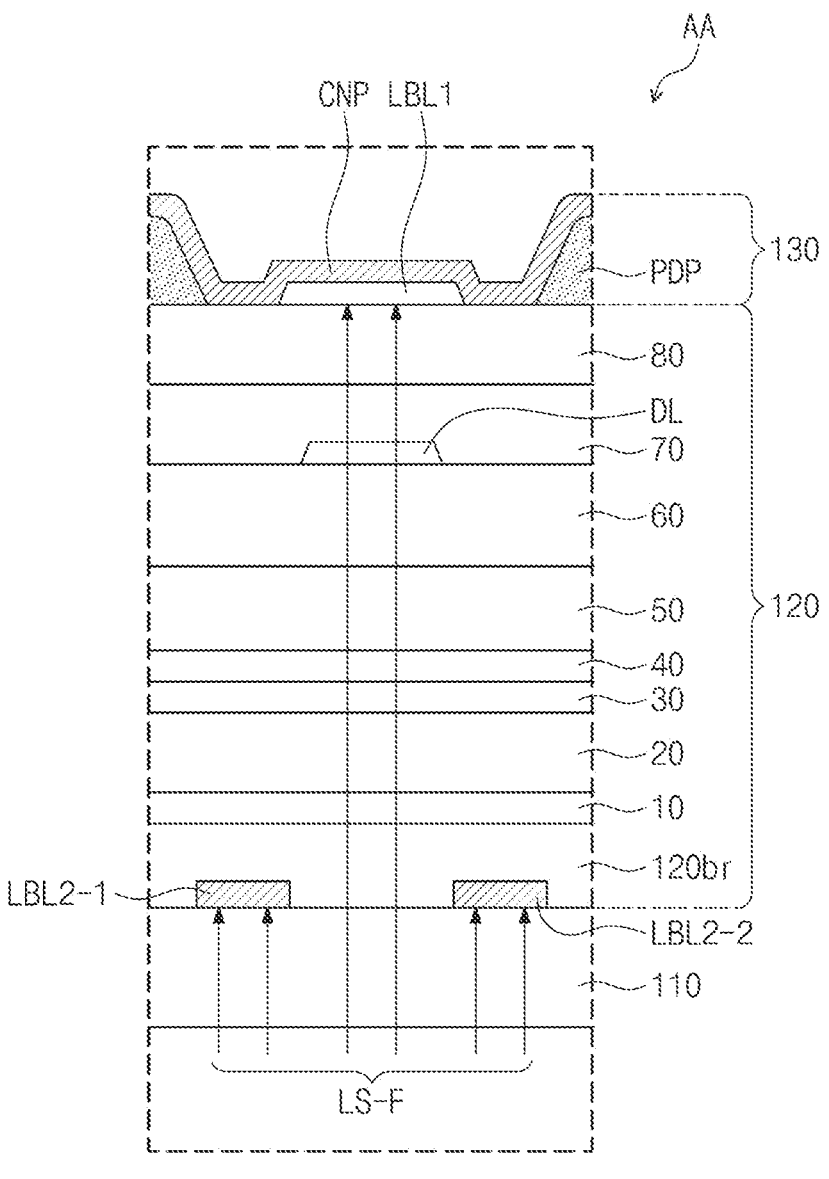
FIGS. 13A-13B are enlarged cross-sectional views illustrating some operations of a method of manufacturing a display panel according to an embodiment of the present disclosure.
Figure 13B:
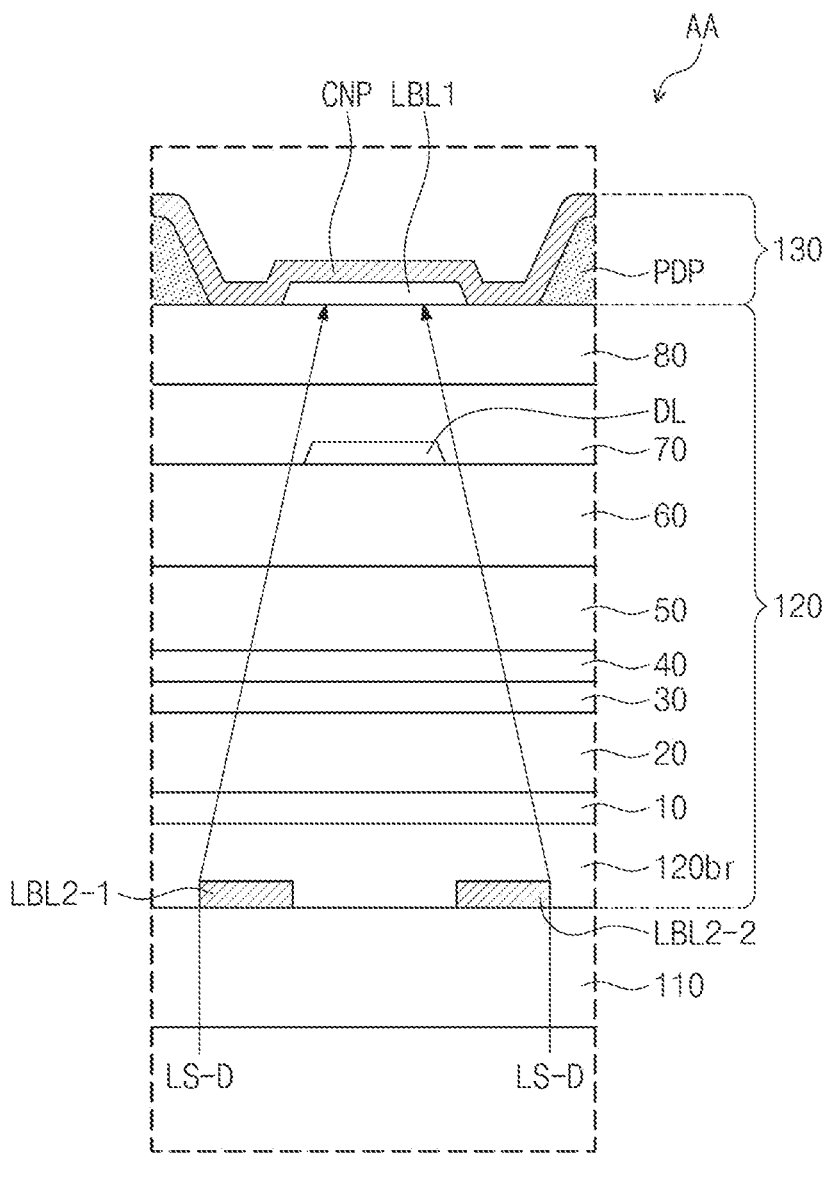

FIGS. 12A and 12B are cross-sectional views of some operations of a method of manufacturing a display panel according to an embodiment of the present disclosure. FIGS. 13A and 13B are enlarged cross-sectional views illustrating some operations of a method of manufacturing a display panel according to an embodiment of the present disclosure. FIG. 12A is a cross-sectional view illustrating some operations of the method of manufacturing the display panel at a portion corresponding to FIG. 10. FIG. 12B is a cross-sectional view illustrating some operations of the method of manufacturing the display panel at a portion corresponding to FIG. 11. FIGS. 13A and 13B are enlarged views of the region AA illustrated in FIG. 12B.

The method of manufacturing a display device according to an embodiment includes emitting a laser from a lower side of a preliminary display panel after providing the preliminary display panel.

Referring to FIGS. 10 and 12A together, the preliminary display panel may be formed by forming the base layer 110 and the circuit layer 120, and then forming the first lower electrodes AE1-a and AE1-b, the first light-emitting layers EL1-a and EL1-b, and preliminary first upper electrodes CE1-ap, CE1-bp, and CE1-R. Compared to the complete display panel 100 according to an embodiment, the preliminary display panel may be formed such that the encapsulation layer 140 is not formed, and the preliminary first upper electrodes CE1-ap and CE1-bp, CE1-R are not patterned and overlap with both the element region DA and the transmission region TA.

The method of manufacturing a display device according to an embodiment may include removing some of the preliminary first upper electrodes CE1-ap, CE1-bp, and CE1-R by irradiating the preliminary display panel with a laser LS. The laser LS may be an infrared laser. The laser LS may be emitted to a removal portion CE1-R that overlaps with the transmission region TA from among the preliminary first upper electrodes CE1-ap, CE1-bp, and CE1-R. The removal portion CE1-R is removed by the laser LS, and as illustrated in FIG. 10, the first upper electrodes CE1-a and CE1-b are formed, and the electrode openings CE1-OP may be formed between the adjacent first upper electrodes CE1-a and CE1-b. The laser LS emitted to a portion overlapping with the element region DA may be blocked by the pixel defining pattern PDP and the first lower electrodes AE1-a and AE1-b, and may not enter the first upper electrodes CE1-a and CE1-b.

Referring to FIGS. 11 and 12B together, in the irradiating of the preliminary display panel with the laser LS, a portion of the laser LS may be emitted to the wiring region CA, and the light blocking pattern LBL may be disposed at (e.g., in or on) the wiring region CA to block the laser LS. The light blocking pattern LBL may include a metal material to absorb or reflect the laser LS. Accordingly, the connection part CNP may not be removed by the laser LS.

In more detail, as illustrated in FIGS. 12B and 13A, a directly emitted laser LS-F entering from a direction below may be blocked by each of the first light blocking pattern LBL1 and the second light blocking pattern LBL2, and may not reach the connection part CNP. The directly emitted laser LS-F entering from the portion of the second gap B-OP defined between the first sub blocking pattern LBL2-1 and the second sub blocking pattern LBL2-2 is blocked by the first light blocking pattern LBL1, and the directly emitted laser LS-F entering from a portion on which the first light blocking pattern LBL1 is not disposed is blocked by the second light blocking pattern LBL2. Therefore, the directly emitted laser LS-F may not reach the connection part CNP.

In addition, as illustrated in FIG. 13B, a diffraction laser LS-D diffracted by the second light blocking pattern LBL2 disposed below may also not reach the connection part CNP. The diffraction laser LS-D may be diffracted from the edge of the second light blocking pattern LBL2, refracted by a suitable diffraction angle (e.g., a predetermined diffraction angle), and may enter the upper portion. The diffraction laser LS-D may be diffracted at an end of each of the first sub blocking pattern LBL2-1 and the second sub blocking pattern LBL2-2. The diffraction laser LS-D refracted by the suitable diffraction angle (e.g., the predetermined diffraction angle) may be blocked by the first light blocking pattern LBL1 disposed thereon. Accordingly, the diffraction laser LS-D may also not reach the connection part CNP.

In the method of manufacturing a display device according to one or more embodiments, a laser entering in a front direction towards a connection part may be blocked by including the first light blocking pattern and the second light blocking pattern, which are disposed to complement each other, and a diffraction laser diffracted by the second light blocking pattern disposed below may also be blocked by the first light blocking pattern disposed thereon. Accordingly, the light blocking pattern may prevent or substantially prevent a portion of the connection part from being removed due to the laser emitted in the process of patterning the upper electrode of the light-emitting element, or may prevent or substantially prevent a defect such as a burr from occurring in the connection part or the upper electrode adjacent thereto, such that the reliability of the display panel and display device including same may be improved.

According to one or more embodiments of the present disclosure, the transmittance of a partial region of the display device may be increased to improve signal quality obtained from an electronic module included in the display device, or a signal output from the electronic module, while defects occurring in a process of patterning electrodes with a laser may be prevented or substantially prevented, thereby improving the reliability of the display device.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising a display panel including a first display region, and a main display region surrounding at least a portion of the first display region, the display panel comprising:

a plurality of first light-emitting elements at the first display region;

a connection part at the first display region, and connecting adjacent first light-emitting elements from among the plurality of first light-emitting elements to each other; and a light blocking pattern overlapping with the connection part in a plan view, wherein the light blocking pattern comprises:

a first light blocking pattern spaced from the plurality of first light-emitting elements with a first gap between the first light blocking pattern and adjacent ones of the first light-emitting elements, the first light blocking pattern being located at a same layer as that at which at least a portion of each of the plurality of first light-emitting elements is located; and a second light blocking pattern under the first light blocking pattern, at least a portion of the second light blocking pattern overlapping with the first gap, and wherein the first light blocking pattern is located between the adjacent ones of the first light-emitting elements in a plan view, and the connection part integrally extends over the first light blocking pattern and directly contacts first upper electrodes of the adjacent ones of the first light-emitting elements to electrically and integrally connect the first upper electrodes of the adjacent ones of the first light-emitting elements to each other.

2. The display device of claim 1, wherein each of the plurality of first light-emitting elements comprises:

a first lower electrode;

a first light-emitting layer on the first lower electrode; and the first upper electrode on the first light-emitting layer, and wherein the first light blocking pattern is located at a same layer at which the first lower electrode is located.

3. The display device of claim 2, wherein the first light blocking pattern and the first lower electrode comprise a same material as each other.

4. The display device of claim 2, wherein the connection part and the first upper electrode comprise a same material as each other.

5. The display device of claim 2, wherein a plurality of electrode openings are defined in the first upper electrode.

6. The display device of claim 2, wherein the first display region comprises:

an element region at which the plurality of first light-emitting elements are located;

a wiring region at which the connection part is located; and a transmission region adjacent to the element region and the wiring region, and wherein each of the first lower electrode and the first upper electrode overlaps with the element region, and does not overlap with the transmission region.

7. The display device of claim 1, wherein the display panel comprises:

a base layer configured to provide a base surface on which the plurality of first light-emitting elements are located; and a circuit layer between the base layer and the plurality of first light-emitting elements, wherein the circuit layer comprises a plurality of insulating layers, and wherein the second light blocking pattern is located on the base layer or on any one layer from among the plurality of insulating layers.

8. The display device of claim 1, wherein:

the second light blocking pattern comprises a first sub blocking pattern and a second sub blocking pattern;

a second gap overlapping with a portion of the connection part is defined between the first sub blocking pattern and the second sub blocking pattern; and the first light blocking pattern overlaps with the second gap.

9. The display device of claim 1, wherein the display panel further includes a second display region adjacent to the first display region, and wherein the display panel further comprises:

a second light-emitting element at the second display region;

a first pixel circuit at the second display region, and configured to drive a corresponding first light-emitting element from among the plurality of first light-emitting elements; and a second pixel circuit at the second display region, and configured to drive the second light-emitting element.

10. The display device of claim 9, wherein the display panel further comprises:

a third light-emitting element at the main display region; and a third pixel circuit at the main display region, and configured to drive the third light-emitting element, and wherein a transmittance of the first display region is higher than a transmittance of the second display region and a transmittance of the main display region.

11. The display device of claim 1, wherein a thickness of the second light blocking pattern is about 100 nm to about 500 nm.

12. The display device of claim 1, further comprising an electronic module located under the display panel, and overlapping with the first display region in a plan view.

13. The display device of claim 1, wherein the light blocking pattern comprises a metal material, and the metal material is configured to absorb or reflect an incident infrared laser.

14. The display device of claim 1, wherein a portion of the second light blocking pattern overlaps with the first light blocking pattern in a plan view.

15. A display device comprising:

a base layer;

a circuit layer on the base layer;

a plurality of first light-emitting elements on the circuit layer;

a connection part configured to connect adjacent first light-emitting elements from among the plurality of first light-emitting elements to each other; and a light blocking pattern overlapping with the connection part in a plan view, wherein each of the plurality of first light-emitting elements comprises:

a first lower electrode;

a first light-emitting layer on the first lower electrode; and a first upper electrode on the first light-emitting layer, wherein the circuit layer comprises a plurality of insulating layers, wherein the light blocking pattern comprises:

a first light blocking pattern spaced from the first lower electrode, and located at a same layer as that of the first lower electrode; and a second light blocking pattern on the base layer or on any one layer from among the plurality of insulating layers, at least a portion of the second light blocking pattern overlapping with a gap defining the space between the first lower electrode and the first light blocking pattern, and wherein the first light blocking pattern is located between the adjacent first light-emitting elements in a plan view, and the connection part integrally extends over the first light blocking pattern and directly contacts the first upper electrode of each of the adjacent first light-emitting elements to electrically and integrally connect first upper electrodes of the adjacent first light-emitting elements to each other.

16. The display device of claim 15, wherein the first light blocking pattern and the first lower electrode comprise a same material as each other.

17. The display device of claim 15, wherein the connection part and the first upper electrode comprise a same material as each other.

* * * * *